United States Patent
Wen et al.

(10) Patent No.: US 12,101,959 B2
(45) Date of Patent: Sep. 24, 2024

(54) DISPLAY PANEL, METHOD FOR MANUFACTURING THE SAME, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Ping Wen, Beijing (CN); Zhiliang Jiang, Beijing (CN); Ge Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 643 days.

(21) Appl. No.: 17/419,620

(22) PCT Filed: Aug. 11, 2020

(86) PCT No.: PCT/CN2020/108428
§ 371 (c)(1),
(2) Date: Jun. 29, 2021

(87) PCT Pub. No.: WO2021/027811
PCT Pub. Date: Feb. 18, 2021

(65) Prior Publication Data
US 2022/0085329 A1   Mar. 17, 2022

(30) Foreign Application Priority Data
Aug. 12, 2019  (CN) .......................... 201910740116.1

(51) Int. Cl.
*H10K 50/844* (2023.01)
*H10K 59/122* (2023.01)
(Continued)

(52) U.S. Cl.
CPC ......... *H10K 50/844* (2023.02); *H10K 59/122* (2023.02); *H10K 59/124* (2023.02);
(Continued)

(58) Field of Classification Search
CPC .. H10K 50/844; H10K 59/122; H10K 59/124; H10K 71/00; H10K 77/111;
(Continued)

(56) References Cited

U.S. PATENT DOCUMENTS

2014/0049157 A1   2/2014  Kim et al.
2014/0353612 A1* 12/2014  Hwang ................. H10K 59/38
                                                          438/34
(Continued)

FOREIGN PATENT DOCUMENTS

CN   206282861 U   6/2017
CN   107785402 A   3/2018
(Continued)

OTHER PUBLICATIONS

First Office Action of Priority Application No. CN 201910740116.1 issued by the Chinese Patent Office on Nov. 2, 2020.
(Continued)

*Primary Examiner* — Kevin Quarterman
(74) *Attorney, Agent, or Firm* — IP & T GROUP LLP

(57) ABSTRACT

A display panel has an active area and a peripheral area. The display panel includes a base, at least one barrier, and a filling pattern. The at least one barrier is disposed on the base and located in the peripheral area. The at least one barrier has a first top face, a first bottom face, and first side faces connected to the first top face and the first bottom face. The
(Continued)

first top face and the first bottom face of the at least one barrier are disposed opposite to each other in a direction perpendicular to the base, and the first bottom face is closer to the base than the first top face. The filling pattern is disposed outside a barrier and located a connecting position between a first side face and the first bottom face. A slope of a side face of an outer contour formed by the barrier and at least one filling pattern as a whole is smaller than a slope of the first side face.

18 Claims, 13 Drawing Sheets

(51) Int. Cl.
*H10K 59/124* (2023.01)
*H10K 71/00* (2023.01)
*H10K 77/10* (2023.01)
*H10K 59/12* (2023.01)
*H10K 102/00* (2023.01)

(52) U.S. Cl.
CPC ............ *H10K 71/00* (2023.02); *H10K 77/111* (2023.02); *H10K 59/1201* (2023.02); *H10K 2102/311* (2023.02)

(58) Field of Classification Search
CPC ......... H10K 59/1201; H10K 2102/311; H10K 50/8426; H10K 71/135; Y02E 10/549
See application file for complete search history.

(56) References Cited

U.S. PATENT DOCUMENTS

| | | | |
|---|---|---|---|
| 2015/0041772 A1 | 2/2015 | Han | |
| 2017/0125745 A1* | 5/2017 | Lee | H10K 71/13 |
| 2018/0006259 A1* | 1/2018 | Paek | H10K 77/10 |
| 2018/0233541 A1* | 8/2018 | Zeng | G06F 3/0445 |
| 2019/0363281 A1* | 11/2019 | Kishimoto | H05B 33/10 |
| 2021/0359270 A1 | 11/2021 | Fan | |
| 2021/0367198 A1* | 11/2021 | Ma | H10K 50/8445 |

FOREIGN PATENT DOCUMENTS

| | | |
|---|---|---|
| CN | 108832017 A | 11/2018 |
| CN | 109671861 A | 4/2019 |
| CN | 109920937 A | 6/2019 |
| CN | 110444571 A | 11/2019 |
| CN | 110556405 A | 12/2019 |

OTHER PUBLICATIONS

The Second Office Action of Priority Application No. CN 201910740116.1 issued by the Chinese Patent Office on May 7, 2021.

Decision of Rejection of Priority Application No. CN 201910740116.1 issued by the Chinese Patent Office on Aug. 6, 2021.

* cited by examiner

DISPLAY PANEL, METHOD FOR MANUFACTURING THE SAME, AND DISPLAY APPARATUS

CROSS-REFERENCE TO RELATED APPLICATIONS

This application is a national phase entry under 35 USC 371 of International Patent Application No. PCT/CN2020/108428 filed on Aug. 11, 2020, which claims priority to Chinese Patent Application No. 201910740116.1, filed on Aug. 12, 2019, which are incorporated herein by reference in their entirety.

TECHNICAL FIELD

The present disclosure relates to the field of display technologies, and in particular, to a display panel and a method for manufacturing the same, and a display apparatus.

BACKGROUND

Self-luminescent display apparatuses such as organic light-emitting diode (OLED) display apparatuses have characteristics of self-luminescence, lightness and thinness, low power consumption, good color reproduction degree, sensitive response, wide viewing angle and the like, and have been more and more widely used in display apparatuses such as mobile phones, notebook computers, and televisions. Moreover, for the above display apparatuses, in order to achieve better visual effects, people have put forward higher demands for narrow bezels.

SUMMARY

In an aspect, a display panel is provided. The display panel has an active area and a peripheral area, and the display panel includes a base, at least one barrier, and a filling pattern. The at least one barrier is disposed on the base and located in the peripheral area. The at least one barrier has a first top face, a first bottom face, and first side faces connected to the first top face and the first bottom face. The first top face and the first bottom face of the at least one barrier are disposed opposite to each other in a direction perpendicular to the base, and the first bottom face is closer to the base than the first top face. The filling pattern is disposed outside a barrier and located at a connecting position between a first side face and the first bottom face. A slope of a side face of an outer contour formed by the barrier and at least one filling pattern as a whole is smaller than a slope of the first side face.

In some embodiments, the filling pattern has a second bottom face, a second side face, and a third side face. The second bottom face is connected to the second side face and the third side face. In a direction from the active area to the peripheral area, the second side face is farther away from the barrier than the third side face. A slope of the second side face is smaller than the slope of the first side face.

In some embodiments, an included angle between the second side face and the second bottom face is approximately less than 30°.

In some embodiments, an included angle between the first side face and the first bottom face is approximately in a range of 30° to 90°, inclusive.

In some embodiments, a number of the at least one filling pattern is multiple, and the multiple filling patterns include a first filling pattern and a second filling pattern. The first filling pattern is located on a side of the barrier close to the active area, and the second filling pattern is located on a side of the barrier away from the active area.

In some embodiments, in a direction from the active area to the peripheral area, a width of the barrier is approximately in a range of 30 μm to 50 μm, inclusive.

In some embodiments, a number of the at least one barrier is multiple, and the multiple barriers include a first barrier and a second barrier. In a direction from the active area to the peripheral area, the first barrier and the second barrier are spaced apart, and the first barrier is closer to the active area than the second barrier. A height of the second barrier is greater than a height of the first barrier.

In some embodiments, the display panel further includes an encapsulation layer covering the active area. The encapsulation layer includes an organic encapsulation layer and inorganic encapsulation layers. An edge of an orthogonal projection of the organic encapsulation layer on the base is located within an edge of an orthogonal projection of a barrier, close to the active area, on the base. The inorganic encapsulation layers further extend to the peripheral area, and an orthogonal projection of the at least one barrier on the base and an orthogonal projection of the at least one filling pattern on the base is located within a range of an orthogonal projection of each inorganic encapsulation layer on the base.

In some embodiments, the organic encapsulation layer and the at least one filling pattern are arranged in a same layer and made of a same material.

In some embodiments, a number of the inorganic encapsulation layers is two, including a first inorganic encapsulation layer and a second inorganic encapsulation layer. The first inorganic encapsulation layer is closer to the base than the second inorganic encapsulation layer, and the organic encapsulation layer is located between the first inorganic encapsulation layer and the second inorganic encapsulation layer.

In some embodiments, in the direction perpendicular to the base, a distance between a top of the filling pattern away from the base and the base is smaller than a distance between the first top face and the base.

In some embodiments, the barrier includes a first pattern. The display panel further includes a pixel defining layer. The pixel defining layer is disposed on the base and located in the active area. The first pattern and the pixel defining layer are arranged in a same layer and made of a same material.

In some embodiments, the barrier further includes a second pattern. The second pattern is located on a side of the first pattern away from the base. The display panel further includes post spacers. The post spacers are located in the active area, and the second pattern and the post spacers are arranged in a same layer and made of a same material. In the direction perpendicular to the base, a distance between a top of the filling pattern away from the base and the base is smaller than a distance between a surface of the second pattern proximate to the base and the base.

In some embodiments, the barrier further includes a third pattern. The third pattern is located on a side of the first pattern proximate to the base. The display panel further includes a planarization layer covering at least the active area. The planarization layer and the third pattern are arranged in a same layer and made of a same material. In the direction perpendicular to the base, a distance between a top of the filling pattern away from the base and the base is smaller than a distance between a surface of the third pattern away from the base and the base.

In some embodiments, the base includes a flexible base.

In another aspect, a display apparatus is provided. The display apparatus includes the display panel according to any one of the above embodiments.

In yet another aspect, a method for manufacturing a display panel is provided. The method includes: providing a base, the base having an active area and a peripheral area; forming at least one barrier on the base and in the peripheral area, the at least one barrier having a first top face, a first bottom face, and first side faces connected to the first top face and the first bottom face; and the first top face and the first bottom face of the at least one barrier being disposed opposite to each other in a direction perpendicular to the base, and the first bottom face being closer to the base than the first top face; and forming a filling pattern outside a barrier and at a connecting position between a first side face and the first bottom face, a slope of a side face of an outer contour formed by the barrier and at least one filling pattern as a whole being smaller than a slope of the first side face.

In some embodiments, the method further includes: forming an encapsulation layer covering the active area on the base, the encapsulation layer including an organic encapsulation layer, and an edge of an orthogonal projection of the organic encapsulation layer on the base being located within an edge of an orthogonal projection of a barrier, close to the active area, on the base; and the organic encapsulation layer and the at least one filling pattern being synchronously formed through an inkjet printing process.

In some embodiments, at the connecting position between the first side face and the first bottom face, a total amount of ink droplets for inkjet printing is approximately in a range of 10 μm³ to 30 μm³, inclusive.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

DETAILED DESCRIPTION

Figure 1:
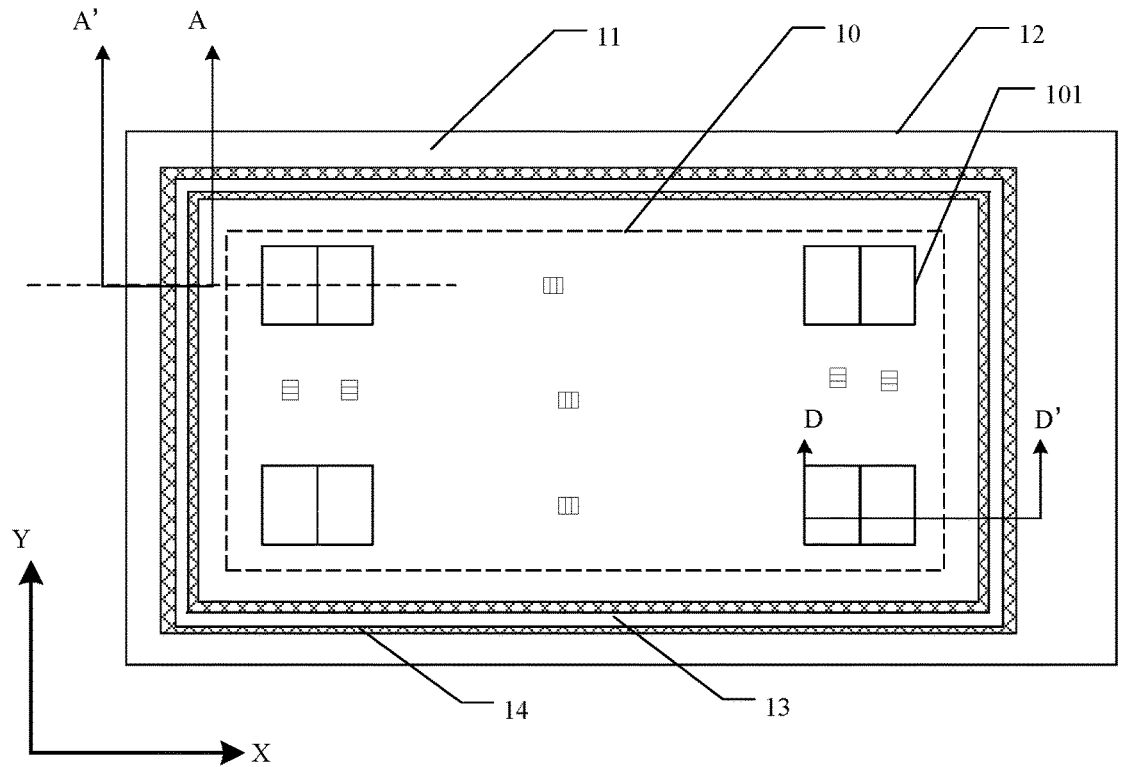
FIG. 1 is a top view of a display panel, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined by "first" or "second" may explicitly or implicitly include one or more of the features. In the description of the embodiments of the present disclosure, term "a plurality of" or "the plurality of" means two or more unless otherwise specified.

In the description of some embodiments, the expressions "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The usage of the phrase "applicable to" or "configured to" herein means an open and inclusive language, which does not exclude apparatuses that are applicable to or configured to perform additional tasks or steps.

The term "about" or "approximately" as used herein includes a stated value and an average value within an acceptable range of deviation of a particular value. The acceptable range of deviation is determined by a person of ordinary skill in the art, in consideration of measurement in question and errors associated with the measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in an apparatus, and are not intended to limit the scope of the exemplary embodiments.

During production and use of an electronic display product, moisture, oxygen and the like in an external environment may infiltrate into an interior of the electronic display product. For example, the moisture, the oxygen and the like may react with structures in the electronic display product to affect its electrical performance, so that performance and a service life of the electronic display product may be reduced. For example, for a display panel such as a flexible organic light-emitting diode display panel, a level of an encapsulation process determines service lives of devices therein. For example, self-luminescent devices may be encapsulated by using thin film encapsulation (TFE) technology. During the encapsulation, an organic encapsulation layer may be formed through an inkjet printing process. In order to confine the organic encapsulation layer to a specific region, a barrier needs to be provided in a peripheral area of the display panel. The larger an included angle between a side face and a bottom face of the barrier is, the better a blocking effect of the barrier on droplets during the inkjet printing process is.

In a process of achieving a narrow bezel, a width of the barrier may be reduced, and the angle between the side face and the bottom face of the barrier may become large accordingly, so that a slope of the side face of the barrier may be large. As a result, stress on subsequent layers at a position of a bottom of the barrier is concentrated (the stress being large), and the layers are easy to crack, which affects performance of the display panel. If the included angle between the side face and the bottom face of the barrier is reduced, planarization of a top face of the barrier may not be ensured, and a process is difficult, which is hard to implement.

Some embodiments of the present disclosure provide a display panel. As shown in FIG. 1, the display panel 1 has an active area (AA) 10 and a peripheral area 11. For example, the peripheral area 11 may be located on at least one side of the active area 10. For example, the peripheral area 11 may surround the active area 10.

Figure 2:
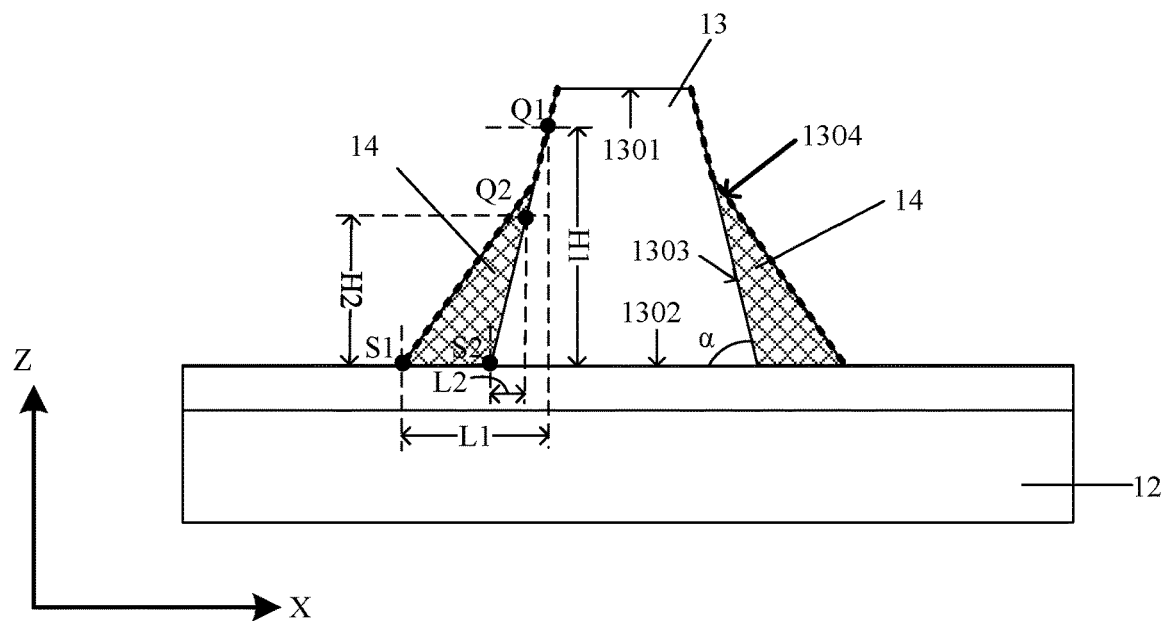
FIG. 2 is a sectional view of the display panel in FIG. 1 taken along the A-A' direction.

As shown in FIGS. 1 and 2, the display panel 1 includes a base 12. For example, the base 12 may include a rigid base substrate (or referred to as a hard base substrate) such as a glass base, or a flexible base substrate such as a polyimide (PI) base; and the base 12 may further include a layer (e.g., a buffer layer) formed on the rigid base substrate or the flexible base substrate.

The display panel 1 further includes a barrier 13 disposed on the base 12 and located in the peripheral area 11. The barrier 13 has a first top face 1301, a first bottom face 1302 and first side faces 1303. The first side faces 1303 are connected to the first top face 1301 and the first bottom face 1302. In a direction perpendicular to the base 12 (e.g., the Z direction in FIG. 2), the first top face 1301 and the first bottom face 1302 are disposed opposite to each other, and the first bottom face 1302 is closer to the base 12 than the first top face 1301.

As shown in FIGS. 1 and 2, the display panel 1 further includes a filling pattern 14. The filling pattern 14 is disposed outside the barrier 13 and located at a connecting position between a first side face 1303 and the first bottom face 1302. A slope of a side face 1304 (e.g., portions indicated by the dashed lines in FIG. 2) of an outer contour formed by the barrier 13 and filling pattern(s) 14 as a whole is smaller than a slope of the first side face 1303. That is to say, the filling pattern(s) 14 are used to make the slope of the side faces 1304 of the outer contour formed by the barrier 13 and the filling pattern(s) 14 as a whole smaller than the slope of the first side face 1303 of the barrier 13.

It will be noted that, a slope of a side face refers to a ratio of a vertical height to a horizontal distance of the side face, i.e., a ratio of a vertical height to a horizontal distance at any position on the side face. For example, as shown in FIG. 2, a vertical height of a Q1 position on a side face 1304 of the outer contour formed by the barrier 13 and the filling pattern(s) 14 as a whole is H1 (i.e., a distance between the Q1 position and the first bottom face 1302 in the Z direction), a horizontal distance of the Q1 position is L1 (i.e., a distance between the Q1 position and an edge of the side face 1304 in an X direction, i.e., a distance between the Q1 position and an end point S1 of the filling pattern 14 farthest away from the barrier 13 in the X direction), and the slope of the side face 1304 is a quotient of H1 and L1 (H1/L1). A vertical height of a Q2 position on the first side face 1303 of the barrier 13 is H2 (i.e., a distance between the Q2 position and the first bottom face 1302 in the Z direction), a horizontal distance of the Q2 position is L2 (i.e., a distance between the Q2 position and an edge of the first side face 1303 where the Q2 position is located in the X direction, i.e., a distance between the Q2 position and an end point S2 of the first bottom face 1302 of the barrier 13 in the X direction), and the slope of the first side face 1303 is a quotient of H2 and L2 (H2/L2). In this case, the quotient of H1 and L1 is smaller than the quotient of H2 and L2 (H1/L1<H2/L2).

Figure 3:
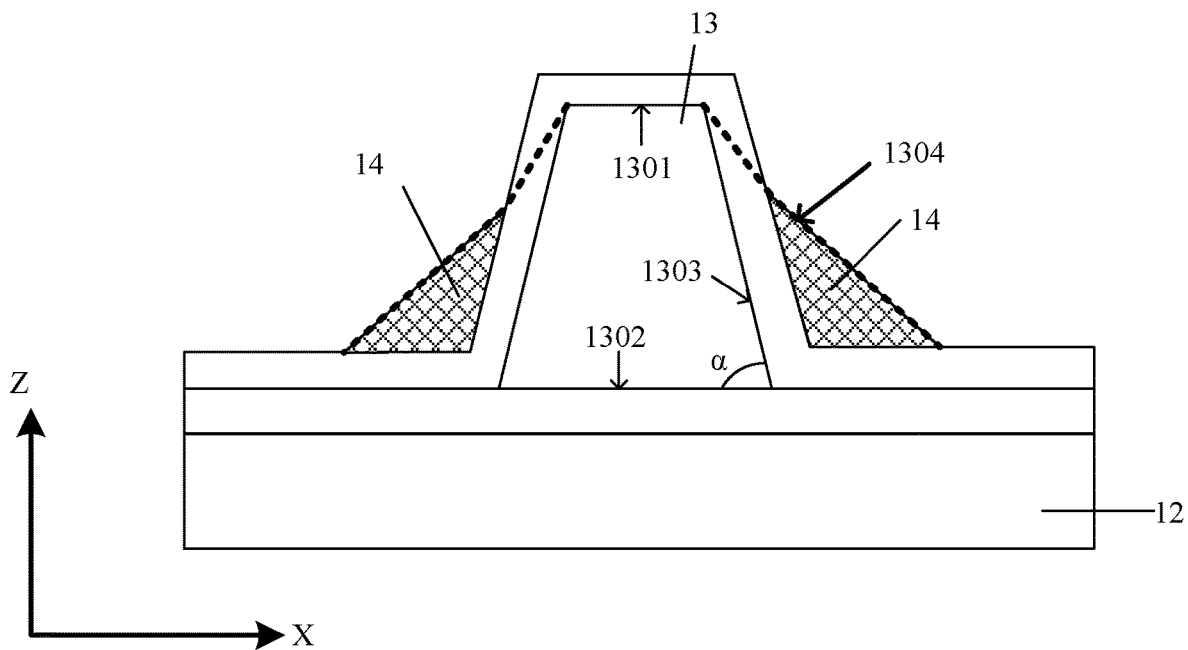
FIG. 3 is a diagram showing a structure of a display panel, in accordance with some embodiments of the present disclosure.

It will be noted that, FIG. 2 shows an example in which the filling patterns 14 are in contact with the barrier 13, but the embodiments of the present disclosure are not limited thereto, and other layer(s) may be provided between the filling patterns 14 and the barrier 13. The embodiments of the present disclosure do not limit a layer that is in contact with a side of the barrier 13 away from the base 12, and the layer may be, for example, an insulating layer (e.g., an inorganic insulating layer). For example, in a case where other layer(s) are provided between the filling patterns 14 and the barrier 13, the barrier 13 and the filling patterns 14 are not in contact. As shown in FIG. 3, the side face 1304 of the outer contour formed by the barrier 13 and the filling patterns 14 as a whole may be considered as a surface formed by extending the side face of the filling pattern 14 away from the barrier 13 (i.e., a second side face 1402 hereinafter) to an edge of the first top face 1301. Alternatively, a side face of any other layer between the filling patterns 14 and the barrier 13 and the side face of the filling pattern 14 may be approximately regarded as the side face 1304 of the outer contour formed by the barrier wall 13 and the filling patterns 14 as a whole.

In addition, the embodiments of the present disclosure do not limit a material of the filling patterns 14. For example, the material of the filling patterns 14 may be a flexible material.

Figure 4:
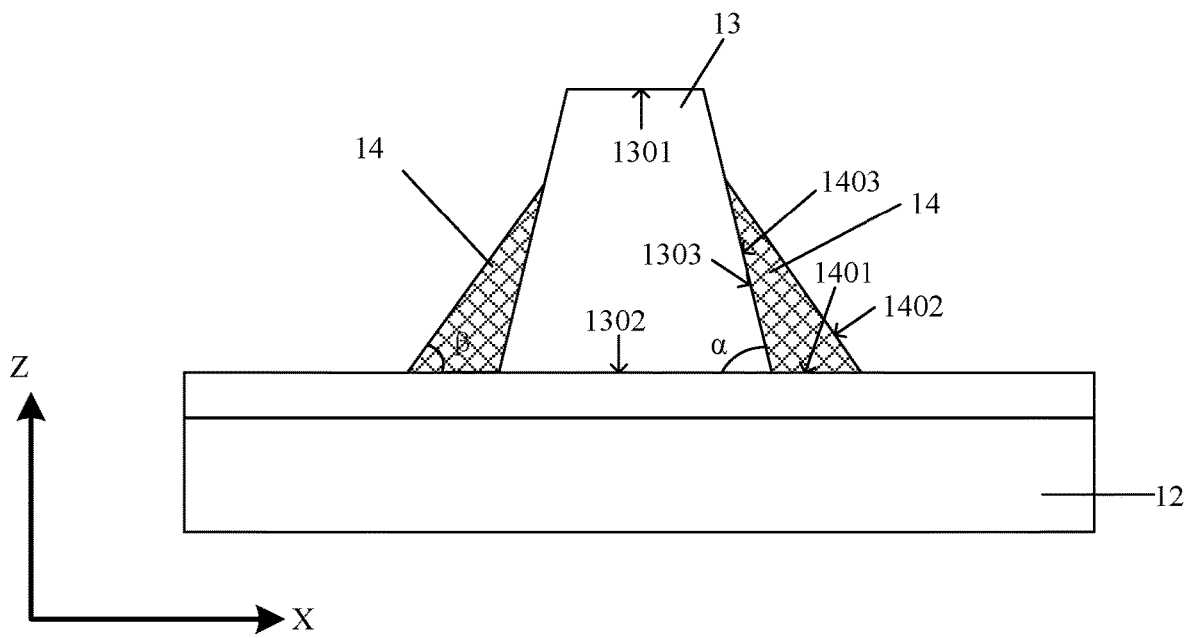
FIG. 4 is a diagram showing a structure of another display panel, in accordance with some embodiments of the present disclosure.

For example, as shown in FIG. 4, the filling pattern 14 has a second bottom face 1401, a second side face 1402 and a third side face 1403. The second bottom face 1401 is connected to the second side face 1402 and the third side face 1403. In the direction from the active area 10 to the peripheral area 11, the second side face 1402 is farther away from the barrier 13 than the third side face 1403, and a slope of the second side face 1402 is smaller than the slope of the first side face 1303.

It will be noted that, for the case where other layer(s) are provided between the filling patterns 14 and the barrier 13, the side faces 1304 of the outer contour formed by the barrier 13 and the filling patterns 14 as a whole may be approximately regarded as the second side faces 1402. That is, a slope of the second side face 1402 may be considered as the slope of the side face 1304 of the outer contour formed by the barrier 13 and the filling patterns 14 as a whole.

In this way, by controlling the slope of the second side faces 1402 of the filling patterns 14, in a case where the filling patterns 14 and the barrier 13 are regarded as a whole, the slope of the side faces of the outer contour of the whole may be made small. That is, by making the slope of the second side faces 1402 of the filling patterns 14 smaller than the slope of the first side face 1303 of the barrier 13, in the case where the filling patterns 14 and the barrier 13 are regarded as a whole, the slope of the side faces of the outer contour of the whole may be made small.

Figure 5:
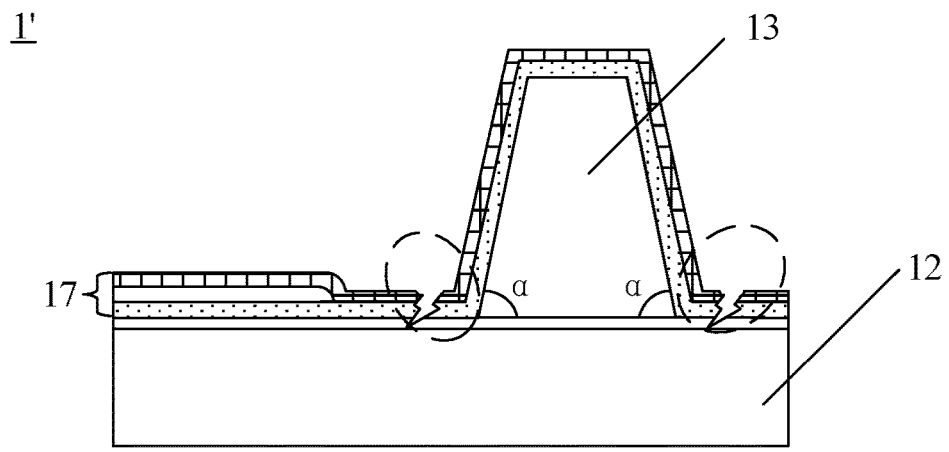
FIG. 5 is a diagram showing a structure of a display panel, in accordance with the related art.

For a display panel 1' shown in FIG. 5, a slope of a first side face of a barrier 13 is large, a slope of subsequent layers (e.g., a second inorganic encapsulation layer 1722 hereinafter) at a connecting position between the first side face and a first bottom face of the barrier 13 (indicated by the dashed oval box in FIG. 5) is large too, so that a problem of concentration of stress to which subsequent layers are subjected at this position may be easy to occur, that is, the stress to which the subsequent layers are subjected at this position is large. As a result, a risk of cracking of the subsequent layers may exist, thereby reducing a blocking effect of the subsequent layers on the moisture, oxygen, impurities and the like. For the display panel 1 in the embodiments of the present disclosure, the filling pattern 14 is arranged outside the barrier 13 and at the connecting position between the first side face 1303 and the first bottom face 1302 of the barrier 13, so that the slope of the side face of the outer contour formed by the barrier 13 and the filling patterns 14 as a whole is smaller than the slope of the first side face 1303, that is, the side face of the outer contour formed by the barrier 13 and the filling patterns 14 as a whole is gentler than the first side face 1303. As a result, a slope of subsequent layers at the connecting position between the first side face 1303 and the first bottom face 1302 of the barrier 13 may be reduced, and the subsequent layers may be gentle, thereby preventing the subsequent layers from being subjected to a large stress at this position, and reducing a risk of cracking of the subsequent layers.

Therefore, for the display panel 1 provided by the embodiments of the present disclosure, the filling pattern 14 is arranged outside the barrier 13 and at the connecting position between the first side face 1303 and the first bottom face 1302 of the barrier 13, so that the slope of the side face of the outer contour formed by the barrier 13 and the filling patterns 14 as a whole is smaller than the slope of the first side face 1303, that is, the side face of the outer contour formed by the barrier 13 and the filling patterns 14 as a whole is gentler than the first side face 1303. Therefore, during subsequent formation of other layers, the slope of the subsequent layers at positions of the filling patterns 14 is also made small correspondingly. In this way, even if the included angle between the first side face 1303 and the first bottom face 1302 of the barrier 13 is large, that is, the slope of the first side face 1303 of the barrier 13 is large, the subsequent layers may also be made gentle at the connecting position between the first side face 1303 and the first bottom face 1302 of the barrier 13. As a result, a problem of concentration of the stress (i.e., large stress) to which the subsequent layers are subjected at the connecting positions between the first side faces 1303 and the first bottom face 1302 of the barrier 13 may be avoided, thereby reducing the risk of cracking of the subsequent layers, improving performance of the display panel 1, and facilitating to achieve a narrow bezel of the display panel 1.

It will be noted that, the embodiments of the present disclosure do not limit a planar shape of the barrier (e.g., a shape of an orthogonal projection of the barrier on a plane where the base is located, e.g., a plane determined by X-Y in FIG. 1). For example, the planar shape of the barrier may be a closed loop surrounding the active area shown in FIG. 1. For example, according to a shape of the active area, the planar shape of the barrier may be set to be a shape such as a rectangular loop, a circular loop, an approximate circular loop, or an ellipse, so that the barrier may have an anti-overflow effect in any direction of the plane. Or the planar shape of the barrier may be a loop with a gap, and the gap is provided in a region where the overflow is not easy to occur, so as to prevent a material of the barrier from swelling when heated and expanded, and to maintain a good anti-overflow effect. For example, in some embodiments of the present disclosure, the planar shape of the barrier (i.e., the shape of the orthogonal projection of the barrier on the plane where the base is located) may be of a segmented type, e.g., including straight line segment(s) or curved line segment(s). For example, the barrier may include at least one segment of sub-barrier e.g., a plurality of segments of sub-barriers, and the plurality of segments of sub-barriers may together enclose a loop. Or, the at least one segment of sub-barrier may be provided only in a region where the overflow is easy to occur, and thus the barrier may be provided in the region of the display panel where the overflow is easy to occur, so as to simplify a structure of a display substrate. In addition, the planar shape of the barrier may not be a rectilinear shape, and may have a curvature. For example, sides of the rectangular loop may have a slight curvature, and each of the segments may have a curvature, etc., as long as a good anti-overflow effect may be achieved, the embodiments of the present disclosure do not limit this.

For example, referring to FIG. 4, the included angle α between the first side face 1303 and the first bottom face 1302 is approximately in a range of 30° to 90°, inclusive. For example, the included angle α is 40°, 60°, or 80°. It will be noted that, the term "approximately" herein refers to a value within an allowable process error range, which is not limited strictly.

In this way, during the subsequent formation of the layers by using an inkjet printing process, a blocking effect of the barrier 13 on droplets may be improved. In a case where a height of the barrier 13 is constant, it may be possible to ensure that a width of the first top face 1301 of the barrier 13 is not excessively small. In this way, the subsequently formed layers (e.g., inorganic encapsulation layers) covering the barrier 13 may be prevented from cracking at the barrier 13 caused by an excessively small width of the first top face 1301 of the barrier 13.

For example, referring to FIG. 4, an included angle β between the second side face 1402 and the second bottom face 1401 is smaller than the included angle α between the first side face 1303 and the first bottom face 1302. For example, the slope of the second side face 1402 may be represented by tan β, and the slope of the first side face 1303 may be represented by tan α. For example, the included angle β between the second side face 1402 and the second bottom face 1401 is approximately less than 30°. For example, the included angle β is 15°, 20°, or 25°.

It will be noted that, the second side face 1402 may be an inclined plane or a curved face (e.g., the second side face 1402 being sunken toward a side of the base 12). In a case where the second side face 1402 is a curved face, the included angle between the second side face 1402 and the second bottom face 1401 may be an included angle between a tangent plane of the second side face 1402 and the second bottom face 1401.

Figure 6A:
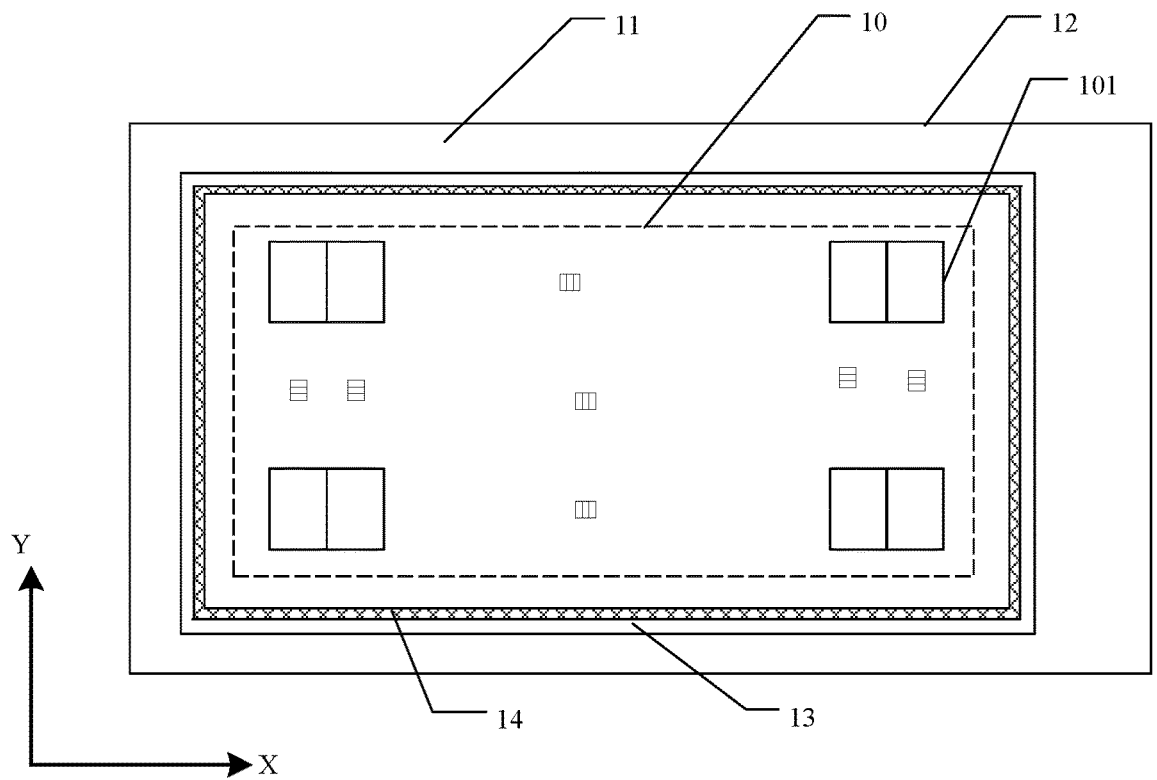
FIG. 6A is a top view of another display panel, in accordance with some embodiments of the present disclosure.

In some embodiments, the filling pattern(s) 14 may be located on at least one outer side of the barrier 13. For example, the filling pattern(s) include one filling pattern, and the filling pattern 14 may be located on one outer side of the barrier 13. For example, as shown in FIG. 6A, the filling pattern 14 is located on a side of the barrier 13 proximate to the active area 10.

Figure 6B:
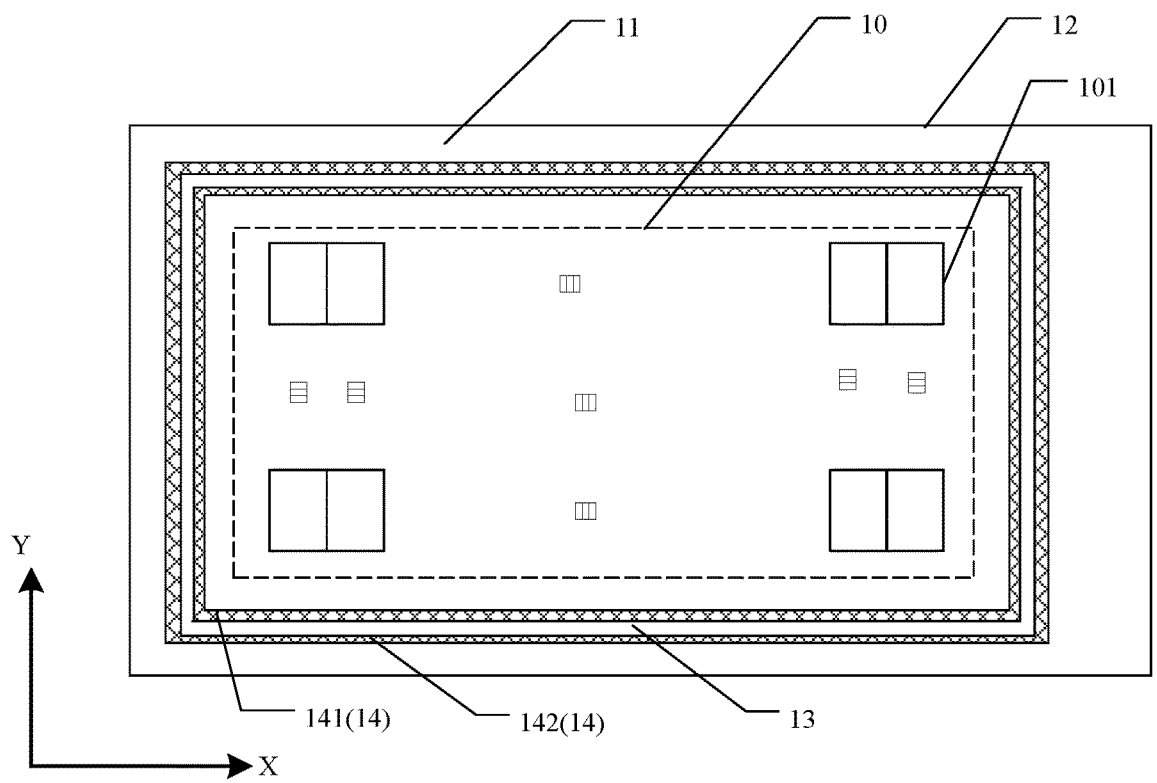
FIG. 6B is a top view of yet another display panel, in accordance with some embodiments of the present disclosure.

For example, the number of the filling pattern(s) 14 is multiple. For example, as shown in FIG. 6B, the multiple filling patterns 14 include a first filling pattern 141 and a second filling pattern 142. The first filling pattern 141 is located on the side of the barrier 13 close to the active area 10. The second filling pattern 142 is located on a side of the barrier 13 away from the active area 10. In this way, in the direction from the active area 10 to the peripheral area 11, the subsequent layers located on two opposite sides of the barrier 13 may be gentle at positions of the first filling pattern 141 and the second filling pattern 142. As a result, it may be possible to avoid the problem of concentration of the stress to which the subsequent layers are subjected, and the stress to which the subsequent layers are subjected may be evenly distributed.

In some embodiments, in the direction from the active area 10 to the peripheral area 11, a width of the barrier 13 is approximately in a range of 30 μm to 50 μm, inclusive. The width of the first top face 1301 and a width of the first bottom face 1302 of the barrier 13 (i.e., dimensions in the direction from the active area 10 to the peripheral area 11) are both in this range.

It can be understood that, in order to achieve the narrow bezel, in a process of reducing the width of the barrier, the slope of the barrier may be correspondingly increased, that is, the included angles between the first side faces and the first bottom face of the barrier may be increased, and the subsequent layers are easy to crack at positions of corners between the first side faces and the first bottom face. Therefore, a range in which the width of the barrier may be reduced is limited. In the embodiments of the present disclosure, the slope of the subsequent layers at the positions of the corners between the first side faces and the first bottom face may be reduced by arranging the filling pattern(s), and even if the included angle between the first side face and the first bottom face of the barrier is large, the slope of side faces of the subsequent layers may also be gentle. As a result, the subsequent layers may be prevented from cracking, and the included angle between the first side face and the first bottom face of the barrier has little influence on the slope of the subsequent layers. Therefore, the width of the barrier in the embodiments of the present disclosure may be greatly reduced, so that the included angle between the first side face and the first bottom face of the barrier may be large, that is, the slope of the first side face of the barrier may be large. In the process of achieving the narrow bezel, it may be possible to ensure planarization of the first top face of the barrier as well as the blocking effect of the barrier on the droplets.

Figure 7A:
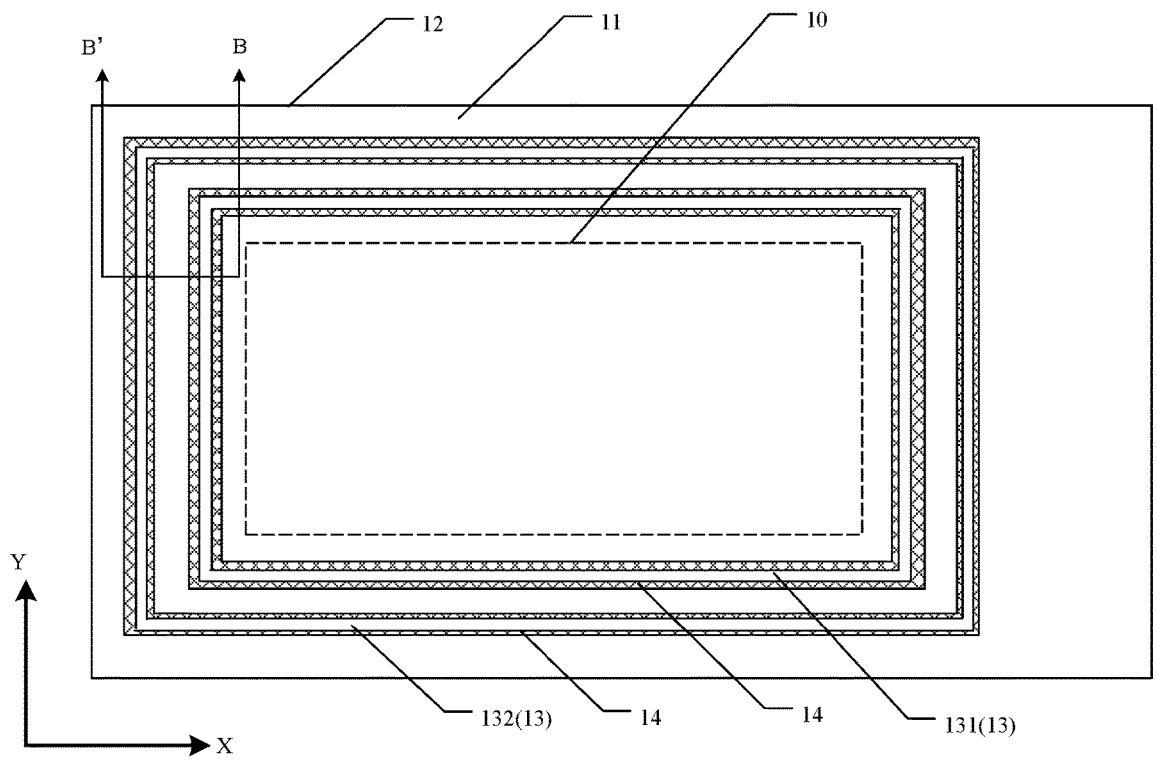
FIG. 7A is a top view of yet another display panel, in accordance with some embodiments of the present disclosure.
Figure 7B:
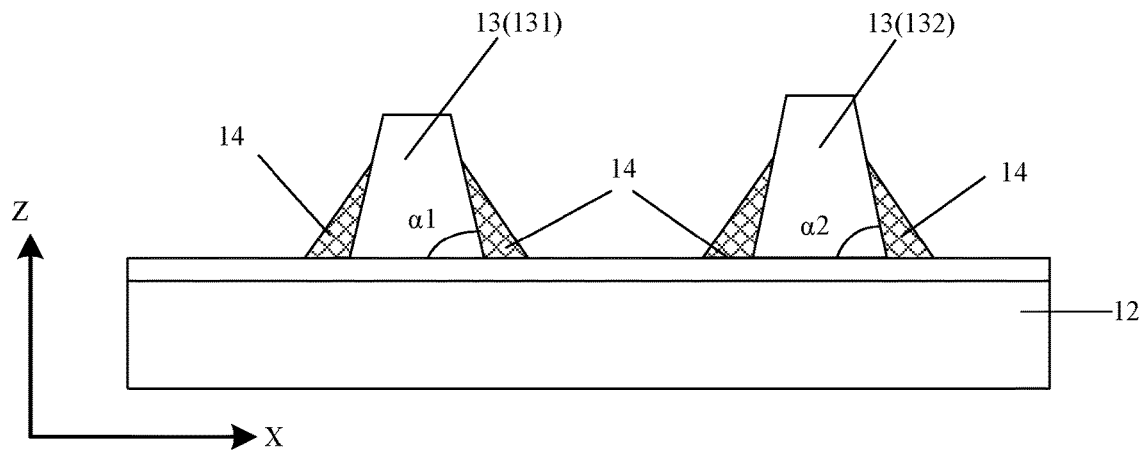
FIG. 7B is a sectional view of the display panel in FIG. 7A taken along the B-B' direction.

In some embodiments, as shown in FIGS. 7A and 7B, there are a plurality of barrier(s) 13, and the plurality of barriers 13 include a first barrier 131 and a second barrier 132. In the direction from the active area 10 to the peripheral area 11, the first barrier 131 and the second barrier 132 are spaced apart, and the first barrier 131 is closer to the active area 10 than the second barrier 132, that is, the first barrier 131 is located between the second barrier 132 and the active area 10. A height of the second barrier 132 is greater than a height of the first barrier 131. The height refers to a distance between the first top face and the first bottom face of the barrier in the direction perpendicular to the base 12. For example, as shown in FIG. 7A, the first barrier 131 and the second barrier 132 may be arranged in a concentric loop shape.

It will be noted that, for a planar shape and an arrangement of each barrier, reference may be made to the above description, which will not be repeated herein. For example, one barrier is in a shape of the closed loop, and another barrier is in a shape of the segmented type; or, both are in the shape of the segmented type, in which at least one opening of one barrier corresponds to a segment of sub-barrier of another barrier. Or, at least one opening of one barrier and at least one opening of another barrier at least partially overlap. Or, one barrier is in the shape of the segmented type, and another barrier is in the shape of the closed loop.

The first barrier 131 may confine an organic encapsulation material into a specific region during formation of, for example, an organic encapsulation layer. For example, an edge of the organic encapsulation layer may be located within a region between the first barrier 131 and edges of the active area 10, so that the organic encapsulation layer may be prevented from overflowing. The second barrier 132 may block the moisture, oxygen, impurities and the like that infiltrate into the display panel 1 from the peripheral area 11. In addition, the second barrier 132 may further avoid the problem that since the first barrier 131 is incapable of completely blocking the organic encapsulating material in the process of forming the organic encapsulation layer, that is, the first barrier 131 has insufficient capability of blocking the organic encapsulating material, the organic encapsulating material extends to a region of the display panel 1 except the specific region, which affects the performance of the display panel 1.

The specific region is generally the active area 10, and may further include a region of the peripheral area 11 that is next to a boundary of the active area 10, and does not exceed a barrier 13 closest to the active area 10 (e.g., the first barrier 131). Generally, the edge of the organic encapsulation layer is within a region confined by the barrier 13 closest to the active area 10 (e.g., the first barrier 131).

For example, the number of the barriers 13 is two, i.e., a first barrier 131 and a second barrier 132. In this way, it may be possible to satisfy the blocking effect on the organic encapsulation material during the formation of the organic encapsulation layer, and to play a role in blocking the moisture, the oxygen and the impurities. Moreover, an area occupied by the two barriers 13 in the peripheral area 11 is small, which facilitates to achieve the narrow bezel of the display panel 1.

For example, as shown in FIG. 7B, in a case where the plurality of barriers 13 include the first barrier 131 and the second barrier 132, the included angle between the first side face and the first bottom face of the first barrier 131 is denoted as α1, the included angle between the first side face and the first bottom face of the second barrier 132 is denoted as α2, and α1 and α2 may be equal or unequal.

Figure 8A:
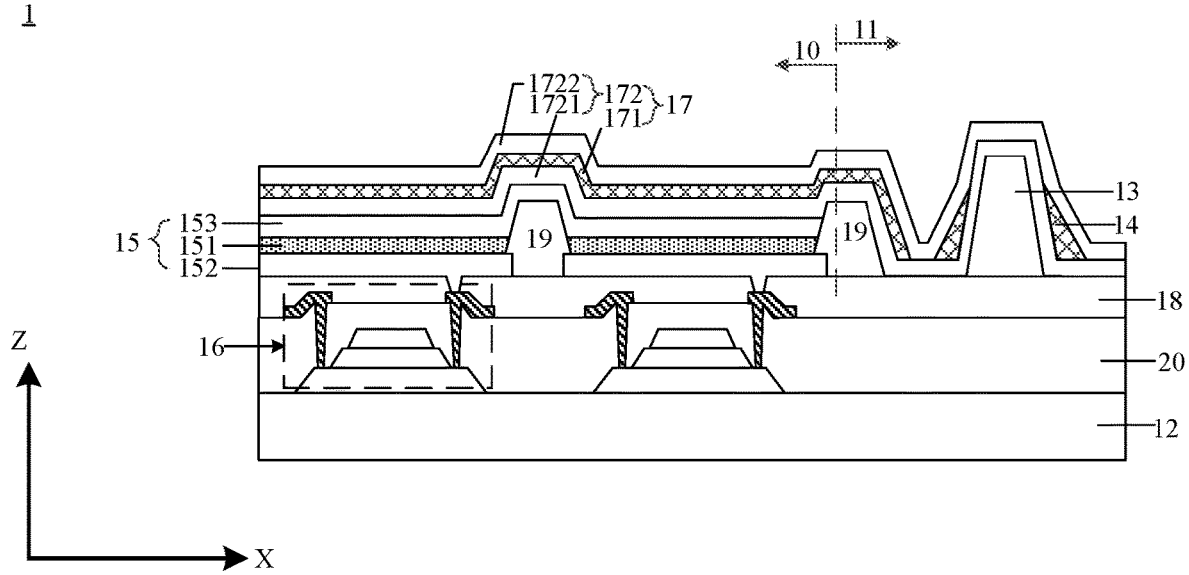
FIG. 8A is a diagram showing a structure of yet another display panel, in accordance with some embodiments of the present disclosure.
Figure 8B:
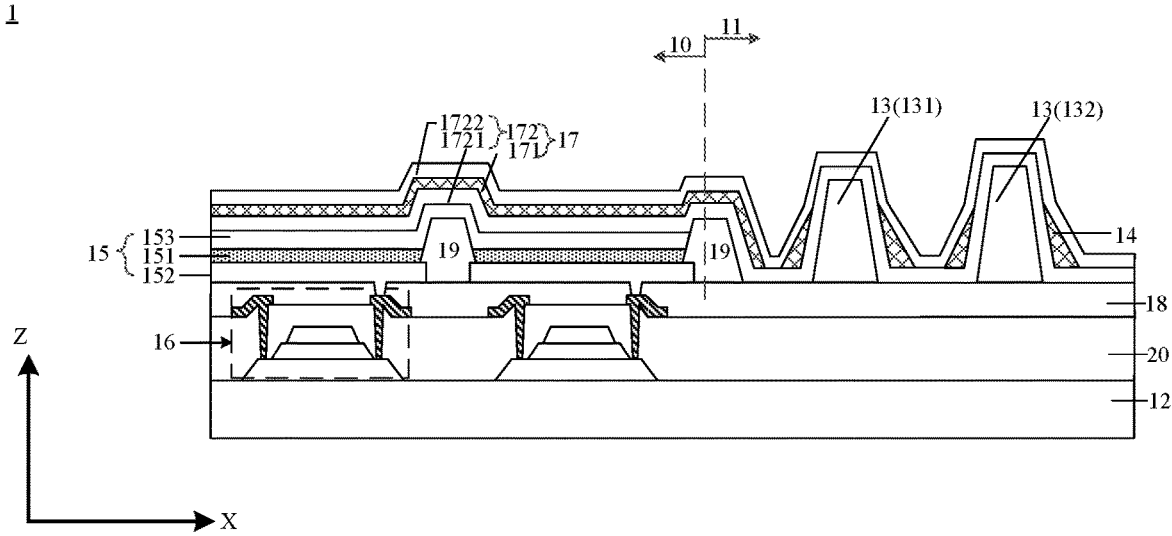
FIG. 8B is a diagram showing a structure of yet another display panel, in accordance with some embodiments.

In some embodiments, as shown in FIGS. 8A and 8B, the display panel 1 further includes an encapsulation layer 17 covering the active area 10. For example, the encapsulation layer 17 may be a thin film encapsulation layer. The encapsulation layer 17 includes the organic encapsulation layer 171 and inorganic encapsulation layers 172. An edge of an orthogonal projection of the organic encapsulation layer 171 on the base 12 is located within an edge of the orthogonal projection of the barrier 13, close to the active area 10, on the base 12. The inorganic encapsulation layers 172 extend to the peripheral area 11, and an orthogonal projection of the inorganic encapsulation layer 172 on the base 12 covers the orthogonal projections of the barrier(s) 13 on the base 12 and orthogonal projections of the filling pattern(s) 14 on the base 12.

For example, a material of the organic encapsulation layer 171 may be, for example, an organic material including acrylic; and a material of the inorganic encapsulation layer 172 may be an inorganic insulating material including silicon nitride and/or silicon oxide.

Figure 7C:
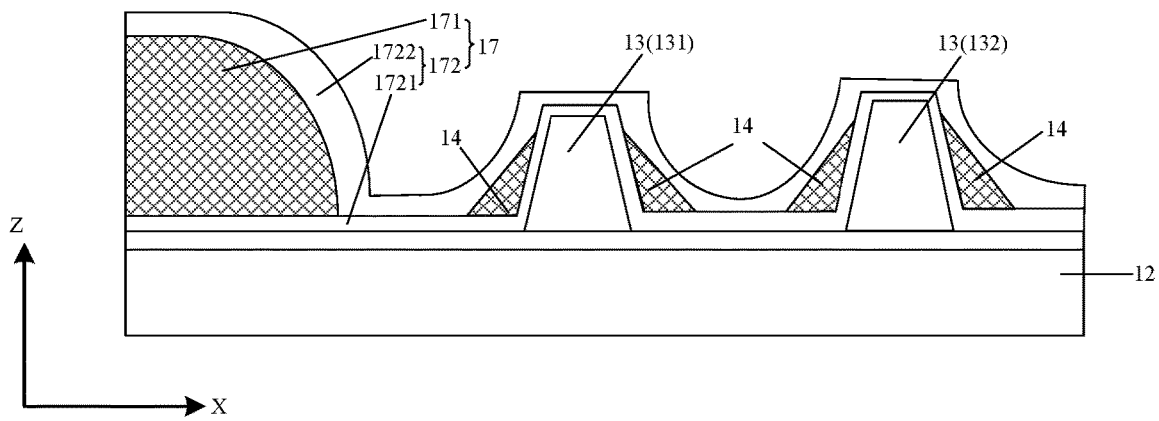
FIG. 7C is a diagram showing a structure of yet another display panel, in accordance with some embodiments of the present disclosure.

It will be noted that, the embodiments of the present disclosure do not limit the numbers of layers of organic encapsulation layer(s) 171 and inorganic encapsulation layer(s) 172. For example, as shown in FIGS. 7C, 8A and 8B, the organic encapsulation layer 171 includes one layer, the inorganic encapsulation layers 172 include two layers, and the organic encapsulation layer 171 is located between the two inorganic encapsulation layers 172. For another example, the organic encapsulation layers 171 include two layers, the inorganic encapsulation layers 172 include three layers, and in a direction facing away from (away from) the base 12 (i.e., the Z direction), the inorganic encapsulation layers 172 and the organic encapsulation layers 171 are alternately arranged in sequence.

It can be understood that, since the inorganic encapsulation layer has a better capability of blocking the moisture and the oxygen than the organic encapsulation layer, in order to ensure an encapsulation effect of the display panel 1, an outermost layer of the encapsulation layer 17 away from the base 12 is an inorganic encapsulation layer. In addition, the organic encapsulation layer 171 has characteristics of good ductility and good flexibility, by providing the organic encapsulation layer 171 in the encapsulation layer 17, the encapsulation layer 17 may have good ductility and flexibility. In addition, the organic encapsulation layer 171 may further prevent the impurity particles therebelow (e.g., inorganic particles in an inorganic encapsulation layer 172) from affecting the preparation of a layer above the organic encapsulation layer 171 (e.g., another inorganic encapsulation layer 172), so as to prevent the layer above the organic encapsulation layer 171 (e.g., the inorganic encapsulation layer 172) from cracking. Moreover, the organic encapsulation layer 171 also plays a role of planarization and may improve uniformity of the subsequent layers.

For example, the organic encapsulation layer 171 and the filling patterns 14 may be arranged in a same layer and made of a same material. In this case, the organic encapsulation layer 171 and the filling patterns 14 may be formed synchronously. For example, they are formed through a same process (e.g. the inkjet printing process), which may simplify manufacturing process and save costs. For example, an interval may exist between the organic encapsulation layer 171 and a filling pattern 14. Alternatively, for example, in the direction from the active area 10 to the peripheral area 11, a filling pattern 14 on a side of the barrier 13 closest to the active area 10 that is close to the active area 10 may be in contact with the organic encapsulation layer 171.

In some embodiments, as shown in FIGS. 8A and 8B, the inorganic encapsulation layers 172 include two layers, which are a first inorganic encapsulation layer 1721 and the second inorganic encapsulation layer 1722. The first inorganic encapsulation layer 1721 is closer to the base 12 than the second inorganic encapsulation layer 1722. The organic encapsulation layer 171 is located between the first inorganic encapsulation layer 1721 and the second inorganic encapsulation layer 1712. In this case, as shown in FIGS. 8A and 8B, a structure in which an inorganic encapsulation layer, an organic encapsulation layer, and an inorganic encapsulation layer are alternately arranged is also formed at the connecting positions (i.e., the positions of the included angles) between the first side faces 1303 and the first bottom face 1302 of the barrier 13. Therefore, the stress at the connecting positions (i.e., the positions of the included angles) between the first side faces 1303 and the first bottom face 1302 of the barrier 13 may be reduced, so that a risk of cracking of the encapsulation layers 17 may be reduced.

In some embodiments, as shown in FIG. 1, the active area 10 is provided with a plurality of sub-pixels 101 therein. For example, the plurality of sub-pixels 101 include at least sub-pixels of a first color, sub-pixels of a second color, and sub-pixels of a third color. For example, the first color, the second color and the third color are three primary colors. For example, the sub-pixels of the first color, the sub-pixels of the second color, and the sub-pixels of the third color are red sub-pixels, green sub-pixels, and blue sub-pixels, respectively.

It will be noted that, the embodiments of the present disclosure do not limit a manner in which the plurality of sub-pixels 101 are arranged, which may be set according to actual conditions. For example, the plurality of sub-pixels 101 are arranged in an array. Sub-pixels in a line arranged in the X direction in FIG. 1 serve as sub-pixels in a same row, and sub-pixels in a line arranged in the Y direction in FIG. 1 may serve as sub-pixels in a same column.

Figure 9A:
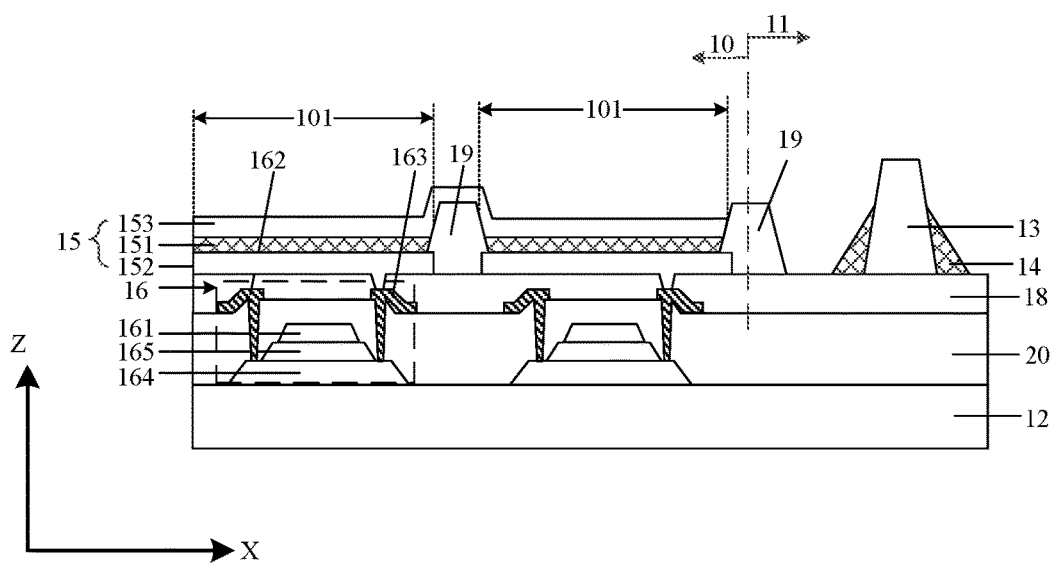
FIG. 9A is a sectional view of the display panel in FIG. 1 taken along the D-D' direction.
Figure 9B:
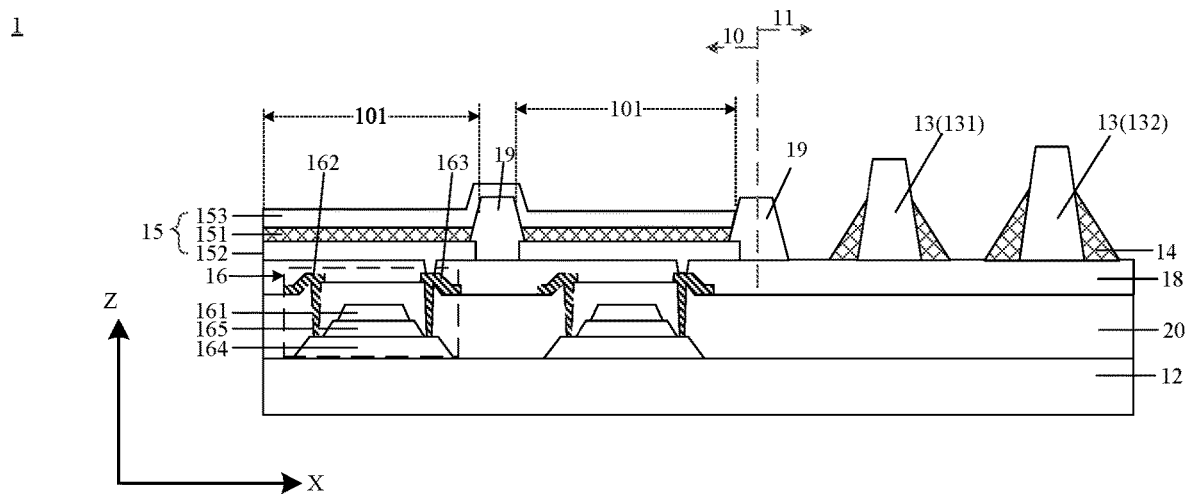
FIG. 9B is a diagram showing a structure of yet another display panel, in accordance with some embodiments.

As shown in FIGS. 9A and 9B, each sub-pixel 101 includes a light-emitting device 15. The light-emitting device 15 includes a light-emitting functional layer 151, and an anode 152 and a cathode 153 that are located on both sides of the light-emitting functional layer 151. It will be noted that, FIGS. 9A and 9B show an example in which the anode 152 is disposed on a side of the light-emitting functional layer 151 proximate to the base 12, and the cathode 153 is disposed on a side of the light-emitting functional layer 151 away from the base 12.

It will be noted that, the embodiments of the present disclosure do not limit materials of the cathode and the anode in the light-emitting device. The anode may be made of, for example, a transparent conductive material with a high work function, and an electrode material thereof may include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), and carbon nanotube. The cathode may be made of, for example, a material with a high conductivity and a low work function, and an electrode material thereof may include alloys such as a magnesium aluminum (MgAl) alloy and a lithium aluminum (LiAl) alloy, or simple metals such as magnesium, aluminum, lithium, and silver (Ag).

Figure 10:
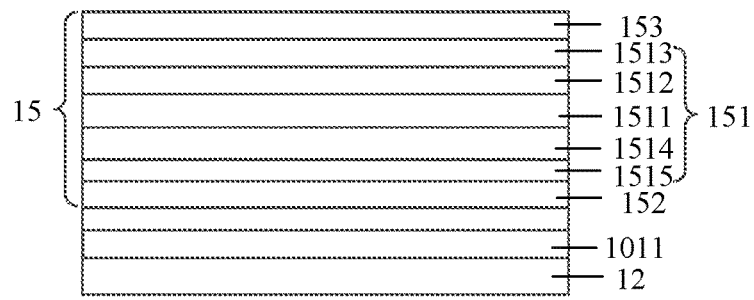
FIG. 10 is a diagram showing a structure of a sub-pixel, in accordance with some embodiments of the present disclosure.

The light-emitting functional layer 151 includes at least a light-emitting layer 1511. As shown in FIG. 10, for example, in addition to the light-emitting layer 1511, the light-emitting functional layer 151 may further include an electron transporting layer (ETL) 1512, an electron injection layer (EIL) 1513, a hole transporting layer (HTL) 1514 and a hole injection layer (HIL) 1515. The ETL 1512 is located between the cathode 153 and the light-emitting layer 1511; the EIL 1513 is located between the ETL 1512 and the cathode 153; the HTL 1514 is located between the anode 152 and the light-emitting layer 1511; and the HIL 1515 is located between the anode 152 and the HTL 1514. Of course, in addition to the light-emitting layer 1511, the light-emitting functional layer 151 may further include some of the ETL 1512, the EIL 1513, the HTL 1514, and the HIL 1515. In addition, the light-emitting functional layer may further include a hole barrier layer and an electron barrier layer. The hole barrier layer may be disposed, for example, between the election transporting layer and the light-emitting layer. The electron barrier layer may be disposed, for example, between the hole transporting layer and the light-emitting layer.

For example, in at least one embodiment of the present disclosure, a material of the light-emitting layer may be selected according to different colors of light emitted thereby. For example, the material of the light-emitting layer includes a fluorescent light-emitting material or a phosphorescent light-emitting material. For example, in at least one embodiment of the present disclosure, the light-emitting layer may adopt a doping system. That is, a dopant material is mixed into the host light-emitting material to obtain a usable light-emitting material. For example, the host light-emitting material may be a metal compound material, an anthracene derivative, an aromatic diamine compound, a triphenylamine compound, an aromatic triamine compound, a biphenyldiamine derivative, or a triarylamine polymer.

On this basis, as shown in FIG. 10, the sub-pixel 101 further includes a pixel driving circuit 1011. The pixel driving circuit 1011 is closer to the base 12 than the light-emitting device 15. The pixel driving circuit 1011 is coupled to the light-emitting device 15. The pixel driving circuit 1011 is configured to drive the light-emitting device 15 to operate.

It will be noted that, FIG. 10 is only a schematic diagram, and does not show a specific circuit structure of the pixel driving circuit 1011, nor does it show specific structures of the pixel driving circuit 1011 and the light-emitting device 15 and a connection relationship therebetween (in practice, an appropriate pixel drive circuit 1011 may be selected as needed).

For example, the pixel driving circuit 1011 may be composed of electronic devices such as thin film transistors (TFTs) and capacitance(s) (C(s)). For example, the pixel driving circuit may be a pixel driving circuit with a 2T1C structure composed of two TFTs (a switching TFT and a driving TFT) and one capacitor. Of course, the pixel driving circuit may also be a pixel driving circuit composed of more than two TFTs (a plurality of switching TFTs and a driving TFT) and at least one capacitor. Regardless of how many TFTs are included in the pixel driving circuit, one of the TFTs is the driving TFT. As shown in FIGS. 9A and 9B, the driving TFT 16 is coupled to the light-emitting device 15. For example, the anode 152 of the light-emitting device 15 may be coupled to a drain 163 of the driving TFT 16 through a via hole in an insulating layer 18 (e.g., the insulating layer 18 may be a passivation layer).

For example, as shown in FIGS. 9A and 9B, the driving TFT 16 may be a top-gate TFT. The top-gate TFT includes an active layer 164, a gate insulating layer 165, a gate 161, and a source 162 and a drain 163 that are sequentially arranged on the base 12. The source 162 and the drain 163 are in contact with the active layer 164 through via holes in an interlayer insulating layer 20. Of course, the driving TFT 16 may also be any one of a bottom-gate TFT and a dual-gate TFT. The TFTs in the pixel driving circuit may be TFTs of a same type. For example, in a case where the driving TFT is the top-gate TFT, other TFT(s) in the pixel driving circuit may also each be a top-gate TFT. For structure(s) of the other TFT(s) in the pixel driving circuit, reference may be made to the structure of the driving TFT 16 described above, and details will not be repeated herein.

In some embodiments, in the direction perpendicular to the base 12, a distance between a top of the filling pattern 14 away from the base 12 and the base 12 is smaller than a distance between the first top face 1301 and the base 12. It can be understood that, the top of the filling pattern 14 away from the base 12 is closer to the base 12 than the first top face 1301. The filling pattern 14 does not overlap the first top face 1301, and an orthogonal projection of the filling pattern 14 on the base 12 does not overlap with an orthogonal projection of the first top face 1301 on the base 12, so that the filling pattern 14 may be prevented from overflowing from the barrier 13.

In some embodiments, as shown in FIGS. 8A, 8B, 9A and 9B, the display panel 1 further includes a pixel defining layer 19 disposed on the base 12 and located in the active area 10. The pixel defining layer 19 may be used to define regions where the sub-pixels 101 of the display panel 1 are located. For example, as shown in FIG. 11, the pixel defining layer 19 may be used to define a position where the light-emitting functional layer 151 of the light-emitting device 15 is formed, and the light-emitting functional layer 151 is located in an opening of the pixel defining layer 19.

Figure 11:
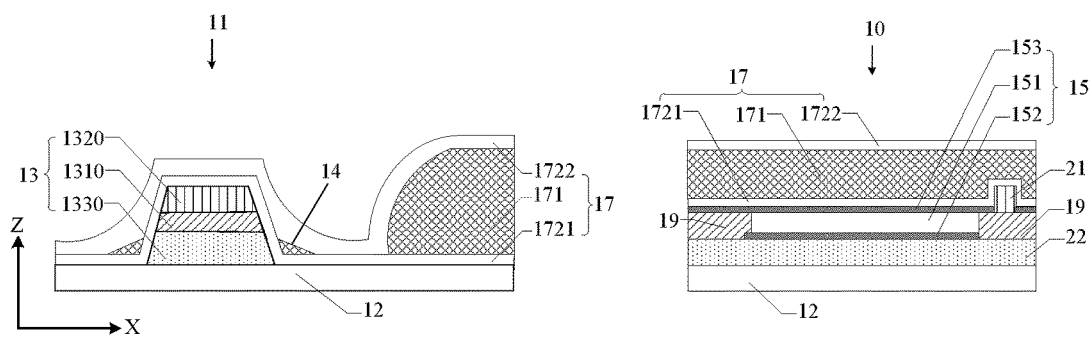
FIG. 11 is a diagram showing a structure of yet another display panel, in accordance with some embodiments of the present disclosure.

For example, as shown in FIG. 11, the barrier 13 includes a first pattern 1310, and the first pattern 1310 and the pixel defining layer 19 are arranged in a same layer and made of a same material. In this way, the first pattern 1310 and the pixel defining layer 19 may be synchronously formed. For example, during the formation of the first pattern 1310 and the pixel defining layer 19, a material layer may be deposited first, and then the material layer is patterned (e.g., processes including exposure, development and etching being performed), so that a portion of the material layer located in the active area 10 is formed as the pixel defining layer 19, and a portion of the material layer located in the peripheral area 11 is formed as the first pattern 1310. In addition, there is an interval between the pixel defining layer 19 and the first pattern 1310. In this way, the formation of the first pattern 1310 does not increase process steps for manufacturing the display panel 1, thereby simplifying the manufacturing process.

For example, in a case where the barrier 13 includes only the first pattern 1310, at least one barrier 13 and the pixel defining layer 19 of the display panel 1 are arranged in a same layer and made of a same material.

Taking the structure shown in FIG. 8A and FIG. 8B as an example, in process, the pixel driving circuit in each sub-pixel 101 is formed in the active area 10 first on the base 12, and of course, circuits and wires may be synchronously formed in the peripheral area 11; thereafter, the insulating layer 18 covering the active area 10 and the peripheral area 11 may be formed, and the anode 152 located in each sub-pixel 101 may be formed on the insulating layer 18; then, the pixel defining layer 19 is formed in the active area 10, and the barrier 13 is synchronously formed in the peripheral area 11; then, the light-emitting functional layer 151 and the cathode 152 that are located in each sub-pixel 101 are formed; and thereafter, the first inorganic encapsulation layer 1721, the organic encapsulation layer 171, and the second inorganic encapsulation layer 1722 may be formed in sequence, and the filling patterns 14 are synchronously formed when the organic encapsulation layer 171 is formed.

In some embodiments, as shown in FIG. 11, the display panel 1 further includes post spacer(s) 21 located in the active area 10. For example, during the manufacturing of the display panel 1, a vapor deposition process is required to form some functional layers (e.g., the light-emitting functional layer 151) of the display panel 1. In the vapor deposition process, the post spacer(s) may be used to support a mask (e.g., a fine metal mask), so that a certain interval may exist between the mask (e.g., mask strips provided with mask patterns in the mask) and a surface of the display panel (which, in this case, is a surface of a portion of the display panel except the post spacer(s)). As a result, it may be possible to avoid poor vapor deposition due to that the mask is completely attached to the surface of the display panel.

For example, as shown in FIG. 11, the barrier 13 further includes a second pattern 1320. The second pattern 1320 is located on a side of the first pattern 1310 away from the base 12. The post spacer(s) 21 and the second pattern 1320 are arranged in a same layer and made of a same material. In this way, the second pattern 1320 and the post spacer(s) 21 may be synchronously formed. For example, during formation of the second pattern 1320 and the post spacer(s) 21, a material layer may be deposited first, and then the material layer is patterned, so that a portion of the material layer located in the active area 10 is formed as the post spacer(s) 21, and a portion of the material layer located in the peripheral area 11 is formed as the second pattern 1320. In addition, there is an interval between the post spacer(s) 21 and the second pattern 1320. In this way, the formation of the second pattern 1320 and the post spacer(s) 21 does not increase the process steps for manufacturing the display panel 1, thereby simplifying the manufacturing process.

For example, in the direction perpendicular to the base 12, the distance between the top of the filling pattern 14 away from the base 12 and the base 12 is smaller than a distance between a surface of the second pattern 1320 proximate to the base 12 and the base 12. That is to say, the top of the filling pattern 14 away from the base 12 is closer to the base 12 than the surface of the second pattern 1320 proximate to the base 12. In this way, a slope of a second side face of the filling pattern 14 may be made small, and the filling pattern 14 may also be prevented from overflowing the barrier 13.

In some embodiments, the pixel defining layer and the post spacer(s) may be made of a same material, so that they may be formed by patterning a layer. In this way, the first pattern and the second pattern of the barrier may be of an integrated structure, and the pixel defining layer, the post spacer(s), the first pattern and the second pattern may all be formed by patterning the layer. Therefore, the manufacturing process of the display substrate may be simplified.

In some embodiments, as shown in FIG. 11, the display panel 1 further includes a planarization layer 22 covering at least the active area 10. For example, during the manufacturing of the display panel 1, the planarization layer 22 may be used to provide a planarized surface to improve the film qualities of structures (e.g., the light-emitting device 15, the pixel defining layer 19, and the encapsulation layers 17) formed on the planarization layer 22, and to improve uniformity of the layers. For example, a material of the planarization layer 22 may include an organic material. Since the organic material is small in stress and large in flexibility, stress to which the display panel 1 is subjected may be buffered, which is beneficial to achieving a flexible design of the display panel 1.

For example, as shown in FIG. 11, the barrier 13 further includes a third pattern 1330. The third pattern 1330 is located on a side of the first pattern 1310 proximate to the base 12. The planarization layer 22 and the third pattern 1330 are arranged in a same layer and made of a same material. In this way, the third pattern 1330 and the planarization layer 22 may be synchronously formed. For example, during formation of the third pattern 1330 and the planarization layer 22, a material layer may be deposited first, and then the material layer is patterned, so that a portion of the material layer located in the active area 10 is formed as the planarization layer 22, and a portion of the material layer located in the peripheral area 11 is formed as the third pattern 1330. In addition, there is an interval between the planarization layer 22 and the third pattern 1330. In this way, the formation of the third pattern 1330 does not increase the process steps for manufacturing the display panel 1, thereby simplifying the manufacturing process.

For example, in the direction perpendicular to the base 12, the distance between the top of the filling pattern 14 away from the base 12 and the base 12 is smaller than a distance between a surface of the third pattern 1330 away from the base 12 and the base 12. That is to say, the top of the filling pattern 14 away from the base 12 is closer to the base 12 than the surface of the third pattern 1330 away from the base 12. In this way, the slope of the second side face of the filling pattern 14 may be made small, and the filling pattern 14 may also be prevented from overflowing the barrier wall 13.

It will be noted that, for convenience of description, FIG. 11 only show some structures in the active area (e.g., including the planarization layer, the pixel defining layer, and the light-emitting device), while other structures (e.g., the pixel driving circuit) are not shown.

For example, the base 12 is a flexible base, and the base 12 may be bent and folded. In this way, the display panel 1 is a flexible display panel, and the display panel 1 has characteristics unique to the flexible display panel such as being bendable and foldable. In this way, when the display panel 1 is bent or folded, since the filling patterns 14 may make the layers at the positions of the filling patterns 14 gentle, it may be possible to avoid the problem of cracking of the layers caused by an excessively large stress to which the layers at the positions of the filling patterns 14 are subjected. As a result, the service life of the display panel 1 may be increased, and the display panel 1 may be made more durable, and lighter and thinner.

Figure 12:
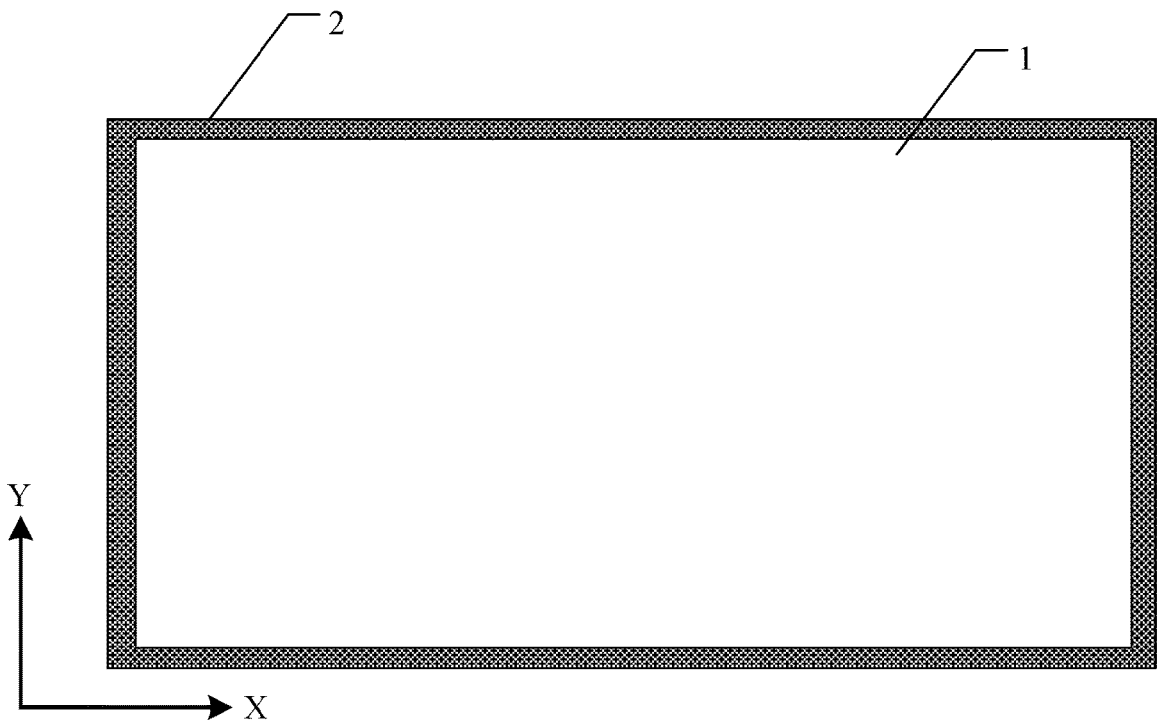
FIG. 12 is a diagram showing a structure of a display apparatus, in accordance with some embodiments of the present disclosure.

Some embodiments of the present disclosure provide a display apparatus including the display panel in any one of the above embodiments. For example, as shown in FIG. 12, the display apparatus 3 further includes an outer frame 2 disposed around the display panel 1. For example, in the display apparatus provided by at least one embodiment of the present disclosure, a touch structure may be provided on a display side of the display panel to obtain a touch function. For example, in the display apparatus provided by at least one embodiment of the present disclosure, the display apparatus further includes a driving circuit coupled to the display panel. The driving circuit is configured to provide a driving signal to the display panel to drive the display panel to operate. For example, a data signal is provided to the pixel driving circuit in the display panel, so that the pixel driving circuit drives the light-emitting device to operate.

For example, the display apparatus may be any apparatus that can display images whether in motion (e.g., a video) or stationary (e.g., a still image), and regardless of text or image. More specifically, it is anticipated that the described embodiments may be implemented in or associated with a variety of electronic devices. The variety of electronic devices may include (but are not limited to), for example, mobile phones, wireless devices, personal data assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat-panel displays, computer monitors, car displays (e.g., odometer displays), navigators, cockpit controllers and/or displays, camera view displays (e.g., rear view camera displays in vehicles), electronic photos, electronic billboards or signs, projectors, building structures, and packaging and aesthetic structures (e.g., a display for an image of a piece of jewelry).

It will be noted that, not all structures of the display panel are described for clarity. In order to achieve necessary functions of the display panel, a person skilled in the art may provide other structures according to specific application scenarios, and the embodiments of the present disclosure do not limit this. The display apparatus has same beneficial effects as the above display panel, and details will not be repeated herein.

Figure 13:
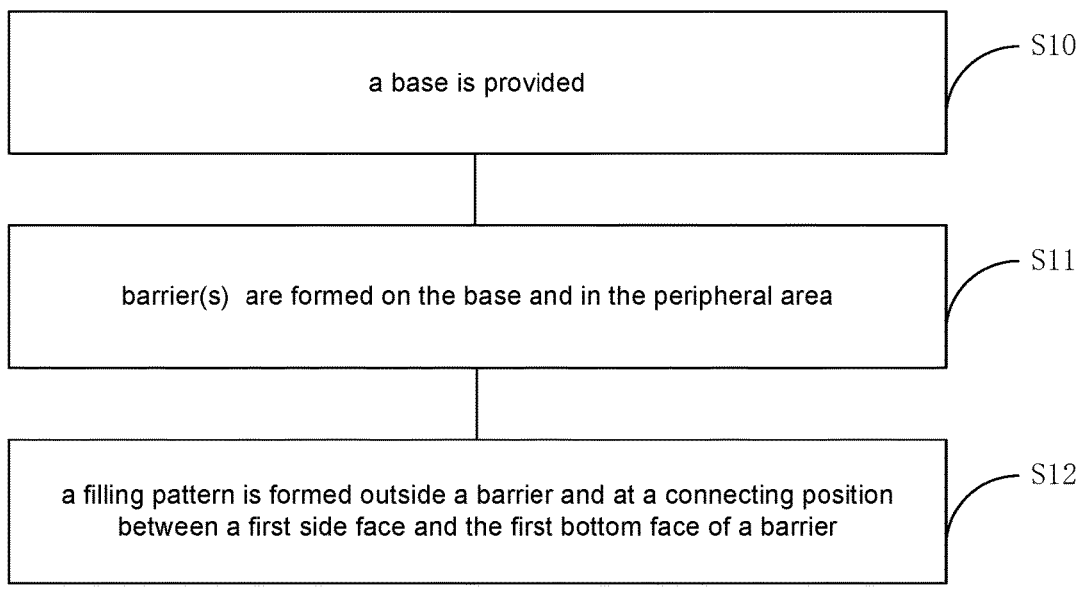
FIG. 13 is a flow diagram of a method for manufacturing a display panel, in accordance with some embodiments of the present disclosure.
Figure 14A:
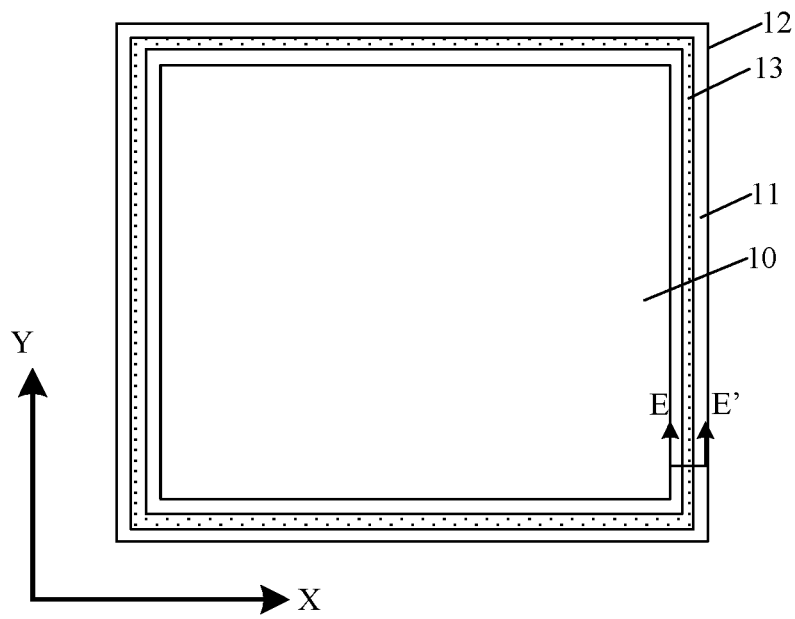
FIG. 14A is a top view of yet another display panel, in accordance with some embodiments of the present disclosure.
Figure 14B:
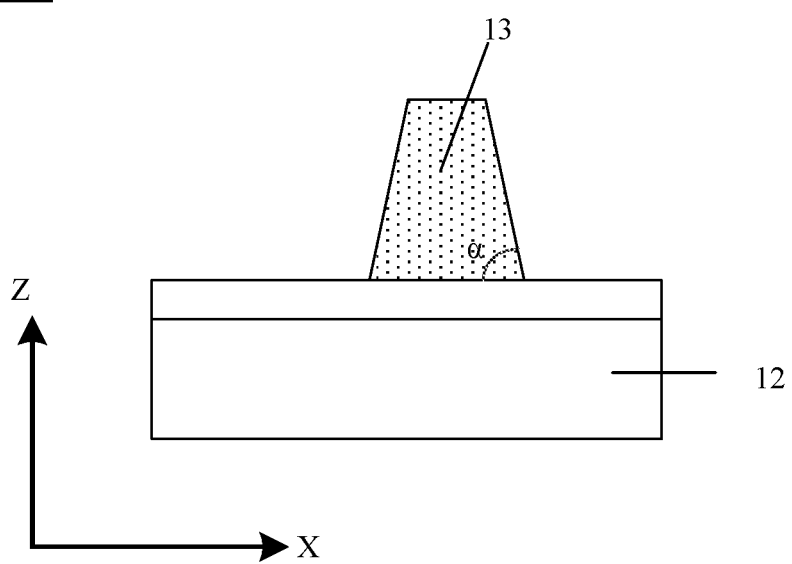
FIG. 14B is a sectional view of the display panel in FIG. 14A taken along the E-E' direction.
Figure 14C:
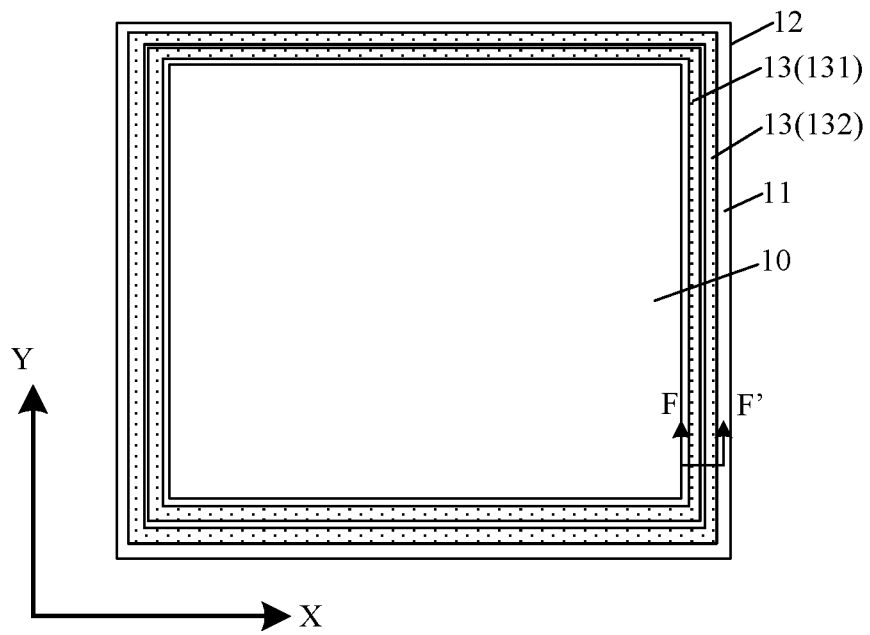
FIG. 14C is a top view of yet another display panel, in accordance with some embodiments of the present disclosure.
Figure 14D:
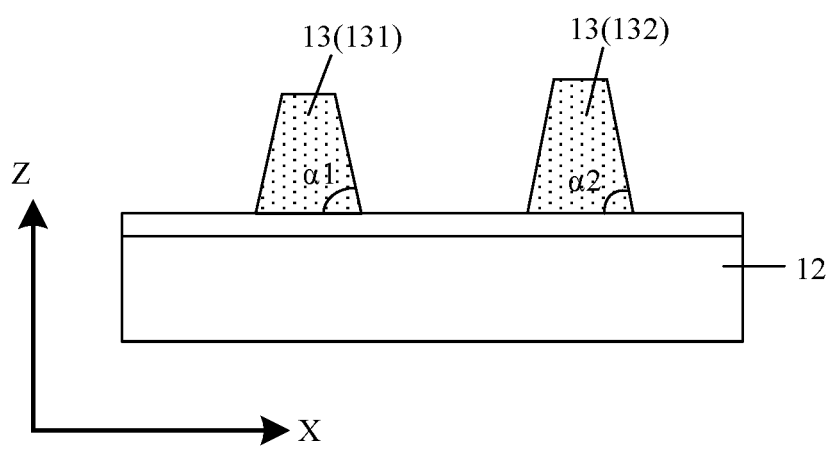
FIG. 14D is a sectional view of the display panel in FIG. 14C taken along the F-F' direction.

Some embodiments of the present disclosure provide a method for manufacturing a display panel, and the display panel may be the display panel in any one of the above embodiments. As shown in FIG. 13, the method includes the following steps.

In S10, as shown in FIG. 1, a base 12 is provided. The base 12 has an active area 10 and a peripheral area 11. It will be noted that, the active area of the base 12 is an active area of the display panel 1, and the peripheral area of the base 12 is a peripheral area of the display panel 1.

In S11, as shown in FIGS. 14A to 14D, barrier(s) 13 are formed on the base 12 and in the peripheral area 11. The barrier(s) 13 have a first top face 1301, a first bottom face 1302, and first side faces 1303 connected to the first top face 1301 and the first bottom face 1302. The first top face 1301 and the first bottom face 1302 of the barrier(s) 13 are disposed opposite to each other in a direction perpendicular to the base 12, and the first bottom face 1302 is closer to the base 12 than the first top face 1301.

In S12, referring to FIGS. 1 and 2, a filling pattern 14 is formed outside a barrier 13 and at a connecting position between a first side face 1303 and the first bottom face 1302 of a barrier 13. A slope of a side face of an outer contour formed by the barrier 13 and filling pattern(s) 14 as a whole is smaller than a slope of the first side face.

For example, the filling pattern(s) 14 may be formed through an inkjet printing process.

Therefore, for the display panel 1 in the embodiments of the present disclosure, by providing the filling pattern(s) 14, the slope of the side face of the outer contour formed by the barrier 13 and the filling patterns 14 as a whole may be made smaller than the slope of the first side face 1303, that is, the side face of the outer contour formed by the barrier 13 and the filling patterns 14 as a whole is gentler than the first side face 1303. Therefore, during subsequent formation of other layers, a slope of the subsequent layers at positions of the filling patterns 14 may be small correspondingly. In this way, even if included angles between the first side faces 1303 and the first bottom face 1302 of the barrier 13 are large, that is, the slope of the first side faces 1303 of the barrier 13 is large, the subsequent layers may also be made gentle at the connecting positions between the first side faces 1303 and the first bottom face 1302 of the barrier 13. As a result, it may be possible to avoid a problem of concentration of stress (i.e., large stress) to which the subsequent layers are subjected at the connecting positions between the first side faces 1303 and the first bottom face 1302 of the barrier 13, so as to reduce a risk of cracking of the subsequent layers, thereby improving performance of the display panel 1.

It will be noted that, FIGS. 14A to 14D show an example in which the barrier(s) 13 are provided on each outer side (i.e., the periphery) of the active area 10, that is, the barrier(s) 13 surround the active area 10, but the embodiments of the present disclosure are not limited thereto.

Figure 15A:
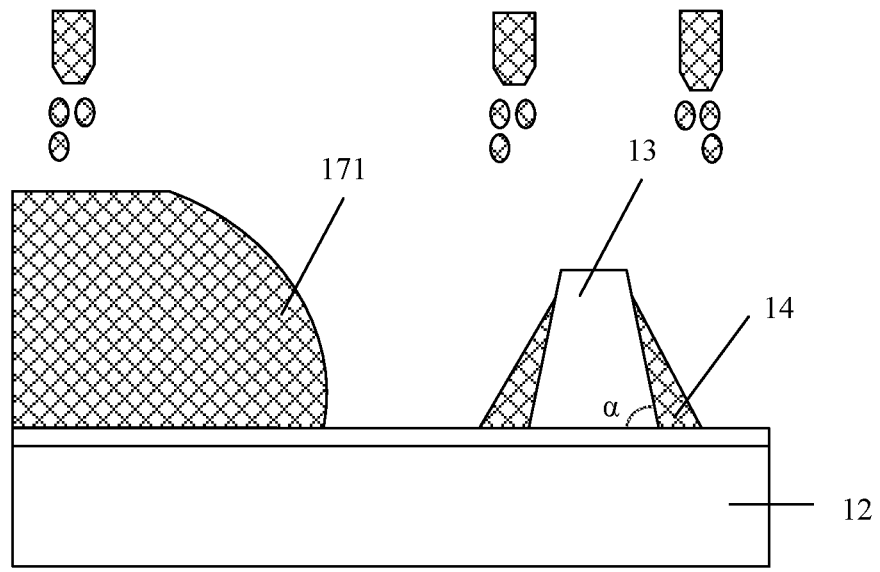
FIG. 15A is a diagram showing a process of manufacturing a display panel, in accordance with some embodiments of the present disclosure.
Figure 15B:
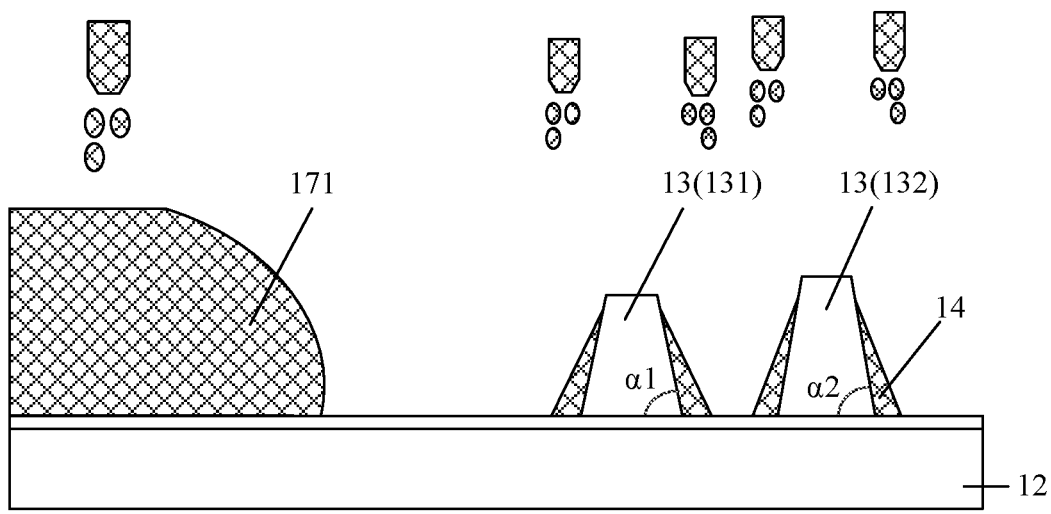
FIG. 15B is a diagram showing a process of manufacturing another display panel, in accordance with some embodiments of the present disclosure.

It will be noted that, FIGS. 15A and 15B show an example in which the filling patterns 14 are in contact with the barrier 13, but the embodiments of the present disclosure are not limited to thereto, and other layers may also be provided between the filling patterns 14 and the barrier 13. For example, an inorganic insulating layer (e.g., a first inorganic encapsulation layer described herein) may be provided between filling patterns 14 and the barrier 13.

In some embodiments, the method for manufacturing the display panel 1 further includes: referring to FIGS. 8A and 8B, forming an encapsulation layer 17 covering the active area 10 on the base 12. The encapsulation layer 17 may be a thin film encapsulation layer, and includes an organic encapsulation layer 171. An edge of an orthogonal projection of the organic encapsulation layer 171 on the base 12 is located within an edge of an orthogonal projection of the barrier 13, close to the active area 10, on the base 12. And, in a case where there are a plurality of barriers 13, the organic encapsulation layer 171 is located within a range defined by a barrier 13 closest to the active area 10. As shown in FIGS. 15A and 15B, the organic encapsulation layer 171 and the filling patterns 14 are synchronously formed through the inkjet printing process.

Figure 15C:
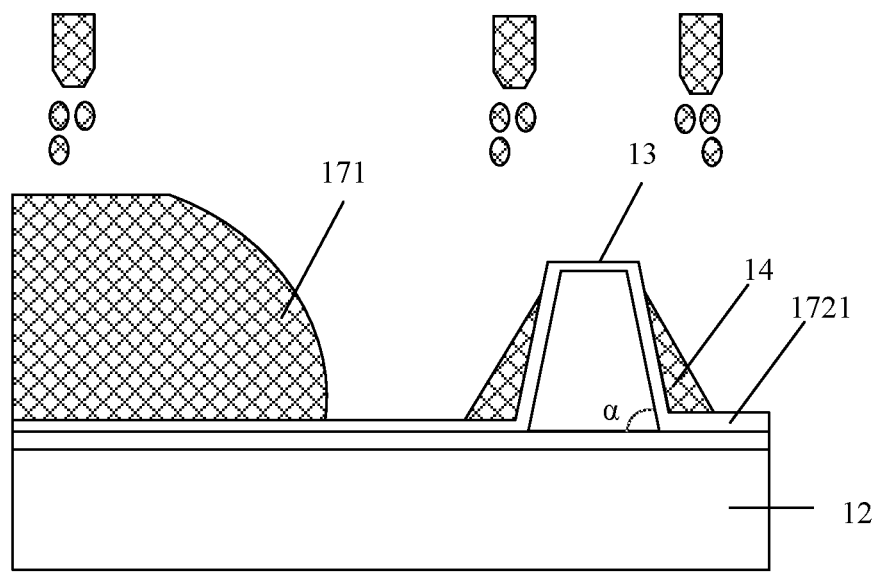
FIG. 15C is a diagram showing a process of manufacturing yet another display panel, in accordance with some embodiments of the present disclosure.
Figure 15D:
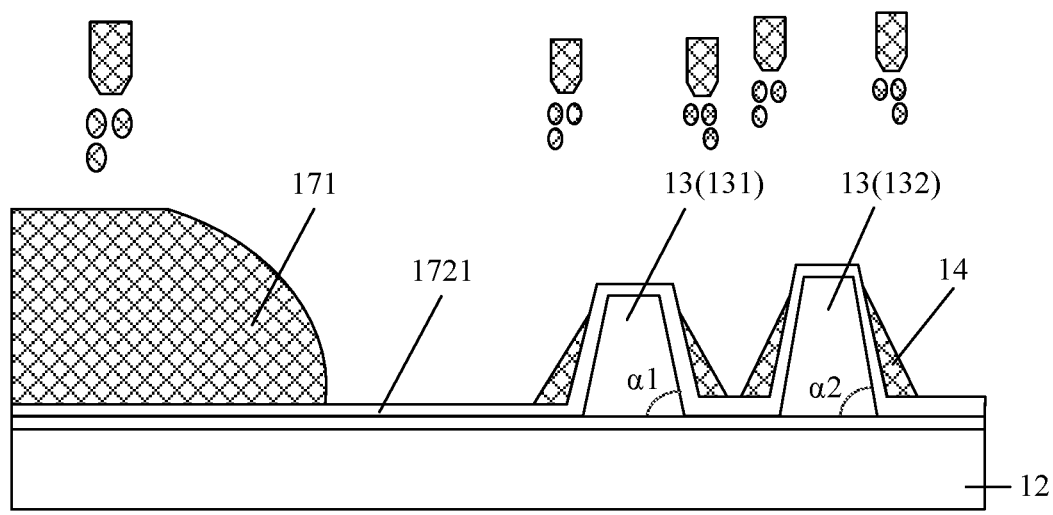
FIG. 15D is a diagram showing a process of manufacturing yet another display panel, in accordance with some embodiments of the present disclosure.

For example, referring to FIGS. 8A and 8B, it is taken as an example that the thin film encapsulation layer 17 are of a three-layer structure, that is, the first inorganic encapsulation layer 1721 is formed first (as shown in FIGS. 15C and 15D), then the organic encapsulation layer 171 and the filling patterns 14 are synchronously formed by using the inkjet printing process, and then a second inorganic encapsulation layer 1722 is formed.

For example, a portion of the first inorganic encapsulation layer 1721 is located between the filling patterns 14 and the barrier 13. In this case, in a case where the barrier 13 and the filling patterns 14 are regarded as a whole, a portion of the first inorganic encapsulation layer 1721 that are in contact with the filling patterns 14 and the barrier 13 may be included in the whole, so that the side faces of the outer contour formed by the barrier wall 13 and the filling patterns 14 as a whole include side faces of the filling patterns 14 (i.e., second side faces) and portions of side faces of the first inorganic encapsulation layer 1721. The organic encapsulation layer 171 and the filling patterns 14 are synchronously formed through the inkjet printing process. When the organic encapsulation layer 171 is formed, the filling patterns 14 are synchronously formed at contact positions between the first side faces of the barrier 13 and a layer in contact with a side of the barrier 13 close to the base 12. In this way, the filling patterns 14 may be formed without increasing manufacturing process.

In this case, the inkjet printing is performed on the organic encapsulation layer 171 and the filling patterns 14 at a same time. By controlling a total amount of ink droplets for the inkjet printing, widths and heights of the formed organic encapsulation layer 171 and filling patterns 14 may be controlled, and the slope of the filling patterns 14 may be controlled. For example, at the connecting position between the first side face 1303 and the first bottom face 1302, the total amount of the ink droplets for the inkjet printing is approximately in a range of 10 $\mu m^3$ to 30 $\mu m^3$, inclusive, and may be, for example, 15 $\mu m^3$, 20 $\mu m^3$ or 25 $\mu m^3$. That is, the total amount of the ink droplets for the inkjet printing that is required to form a filling pattern 14 is approximately in the range of 10 $\mu m^3$ to 30 $\mu m^3$, inclusive.

The forgoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having an active area and a peripheral area, the display panel comprising:
    a base;
    at least one barrier disposed on the base and located in the peripheral area, wherein each of the at least one barrier has a first top face, a first bottom face, and first side faces connected to the first top face and the first bottom face; and the first top face and the first bottom face of each of the at least one barrier are disposed opposite to each other in a direction perpendicular to the base, and the first bottom face is closer to the base than the first top face; and
    at least one filling pattern each disposed outside a single barrier of the at least one barrier and located at a connecting position between a first side face and a first bottom face of the single barrier; and a slope of a side face of an outer contour formed by the single barrier and the at least one filling pattern as a whole being smaller than a slope of the first side face of the single barrier, wherein
    the at least one filling pattern are in contact with the single barrier; and
    in the direction perpendicular to the base, a distance between a top of the at least one filling pattern away from the base and the base is less than a distance between a first top face of the single barrier and the base.

2. The display panel according to claim 1, wherein the at least one filling pattern each has a second bottom face, a second side face, and a third side face; the second bottom face is connected to the second side face and the third side face; in a direction from the active area to the peripheral area, the second side face is farther away from the single barrier than the third side face; and
    a slope of the second side face is smaller than the slope of the first side face of the single barrier.

3. The display panel according to claim 2, wherein an included angle between the second side face and the second bottom face is approximately less than 30°.

4. The display panel according to claim 1, wherein an included angle between the first side face and the first bottom face of the single barrier is approximately in a range of 30° to 90°, inclusive.

5. The display panel according to claim 1, wherein a number of the at least one filling pattern is multiple, and the multiple filling patterns include a first filling pattern and a second filling pattern; and
    the first filling pattern is located on a side of the single barrier closest to the active area, and the second filling pattern is located on a side of the single barrier away from the active area.

6. The display panel according to claim 1, wherein in a direction from the active area to the peripheral area, a width of the single barrier is approximately in a range of 30 μm to 50 μm, inclusive.

7. The display panel according to claim 1, wherein a number of the at least one barrier is multiple, and the multiple barriers include a first barrier and a second barrier;
in a direction from the active area to the peripheral area, the first barrier and the second barrier are spaced apart, and the first barrier is closer to the active area than the second barrier; and
a height of the second barrier is greater than a height of the first barrier.

8. The display panel according to claim 1, further comprising:
an encapsulation layer covering the active area, the encapsulation layer including an organic encapsulation layer and inorganic encapsulation layers, and an edge of an orthogonal projection of the organic encapsulation layer on the base being located within an edge of an orthogonal projection of one, closest to the active area, of the at least one barrier on the base; and
the inorganic encapsulation layers further extending to the peripheral area, and an orthogonal projection of the at least one barrier on the base and an orthogonal projection of the at least one filling pattern on the base being located within a range of an orthogonal projection of each inorganic encapsulation layer on the base.

9. The display panel according to claim 8, wherein the organic encapsulation layer and the at least one filling pattern are arranged in a same layer and made of a same material.

10. The display panel according to claim 8, wherein a number of the inorganic encapsulation layers is two, including a first inorganic encapsulation layer and a second inorganic encapsulation layer; and the first inorganic encapsulation layer is closer to the base than the second inorganic encapsulation layer, and the organic encapsulation layer is located between the first inorganic encapsulation layer and the second inorganic encapsulation layer.

11. The display panel according to claim 1, wherein the single barrier includes a first pattern; and
the display panel further comprises:
a pixel defining layer disposed on the base and located in the active area,
the first pattern and the pixel defining layer being arranged in a same layer and made of a same material.

12. The display panel according to claim 11, wherein the single barrier further includes a second pattern; and the second pattern is located on a side of the first pattern away from the base; and
the display panel further comprises:
post spacers located in the active area, the second pattern and the post spacers being arranged in a same layer and made of a same material, wherein
in the direction perpendicular to the base, a distance between the top of the at least one filling pattern away from the base and the base is smaller than a distance between a surface of the second pattern closest to the base and the base.

13. The display panel according to claim 11, wherein the single barrier further includes a third pattern; and the third pattern is located on a side of the first pattern closest to the base; and
the display panel further comprises:
a planarization layer covering at least the active area,
the planarization layer and the third pattern being arranged in a same layer and made of a same material; wherein
in the direction perpendicular to the base, a distance between the top of the at least one filling pattern away from the base and the base is smaller than a distance between a surface of the third pattern away from the base and the base.

14. The display panel according to claim 1, wherein the base includes a flexible base.

15. A display apparatus, comprising the display panel according to claim 1.

16. A method for manufacturing a display panel, the method comprising:
providing a base, the base having an active area and a peripheral area;
forming at least one barrier on the base and in the peripheral area, each of the at least one barrier having a first top face, a first bottom face, and first side faces connected to the first top face and the first bottom face; and the first top face and the first bottom face of each of the at least one barrier being disposed opposite to each other in a direction perpendicular to the base, and the first bottom face being closer to the base than the first top face; and
forming at least one filling pattern outside a single barrier of the at least one barrier and at a connecting position between a first side face and a first bottom face of the single barrier, a slope of a side face of an outer contour formed by the single barrier and the at least one filling pattern as a whole being smaller than a slope of the first side face of the single barrier, wherein
the at least one filling pattern are in contact with the single barrier; and
in the direction perpendicular to the base, a distance between a top of the at least one filling pattern away from the base and the base is less than a distance between the first top face of the single barrier and the base.

17. The method according to claim 16, further comprising:
forming an encapsulation layer covering the active area on the base, the encapsulation layer including an organic encapsulation layer, and an edge of an orthogonal projection of the organic encapsulation layer on the base being located within an edge of an orthogonal projection of one, closest to the active area, of the at least one barrier on the base; and
the organic encapsulation layer and the at least one filling pattern being synchronously formed through an inkjet printing process.

18. The method according to claim 17, wherein at the connecting position between the first side face and the first bottom face of the single barrier, a total amount of ink droplets for inkjet printing is approximately in a range of 10 $\mu m^3$ to 30 $\mu m^3$, inclusive.

* * * * *